United States Patent [19]
Buckley et al.

[11] 4,068,947
[45] Jan. 17, 1978

[54] OPTICAL PROJECTION AND SCANNING APPARATUS

[75] Inventors: Jere D. Buckley; David A. Markle, both of Norwalk, Conn.; William H. Newell, Mount Vernon, N.Y.; Abe Offner, Darien, Conn.

[73] Assignee: The Perkin-Elmer Corporation, Norwalk, Conn.

[21] Appl. No.: 671,653

[22] Filed: Mar. 29, 1976

Related U.S. Application Data

[63] Continuation of Ser. No. 339,860, March 9, 1973, abandoned.

[51] Int. Cl.² .................. G03B 27/58; G03B 27/62
[52] U.S. Cl. .................................. 355/72; 355/66; 355/75
[58] Field of Search .................. 355/50, 51, 53, 54, 355/72, 73, 74, 75, 76, 8, 64, 65, 66

[56] References Cited

U.S. PATENT DOCUMENTS

| | | |
|---|---|---|
| 3,139,013 | 6/1964 | Graves ................................ 355/3 |
| 3,592,114 | 7/1971 | Minett ............................ 355/50 X |
| 3,610,750 | 10/1971 | Lewis ............................ 355/54 X |
| 3,722,996 | 3/1973 | Fox ................................ 355/54 X |
| 3,732,009 | 5/1973 | Callum .......................... 355/75 X |

Primary Examiner—Edna M. O'Connor
Attorney, Agent, or Firm—S. A. Giarratana; F. L. Masselle; E. T. Grimes

[57] ABSTRACT

A unity magnification catoptric image-forming system and an illumination system on the one hand, and an object- and image-surface supporting means on the other hand, are arranged for relative movement to retain the object and image surfaces in unity magnification conjugate planes of the catoptric system while effecting a scanning-type exposure of successive portions of the image surface to successively illuminated portions of the object. Fine motion mechanisms permit accurate preliminary adjustment of the object- and image-receiving surfaces relative to each other while under visual examination with the aid of the catoptric image-forming system.

8 Claims, 18 Drawing Figures

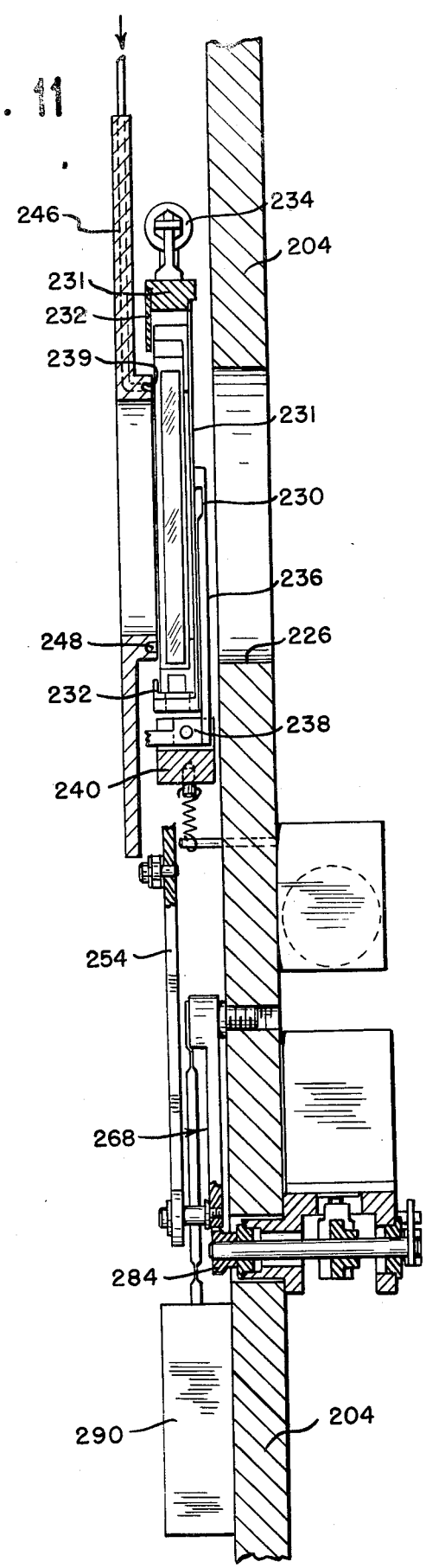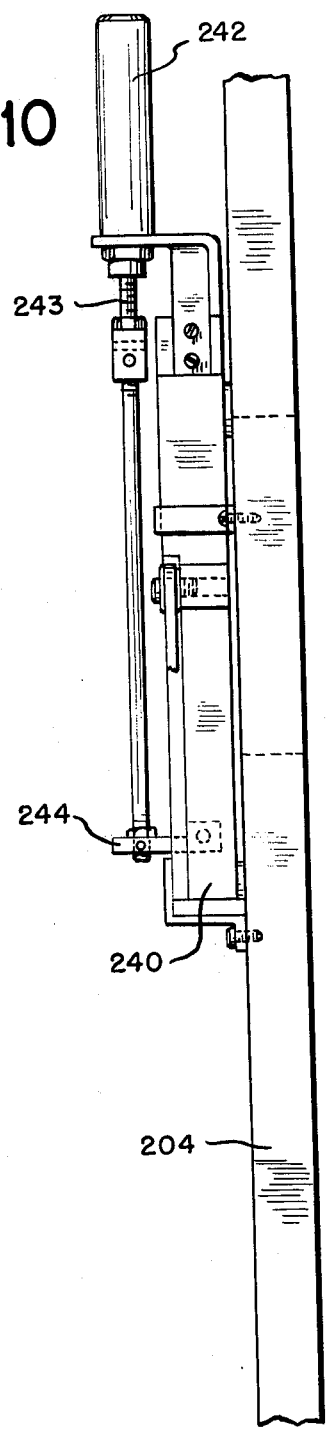
FIG. 11
FIG. 10

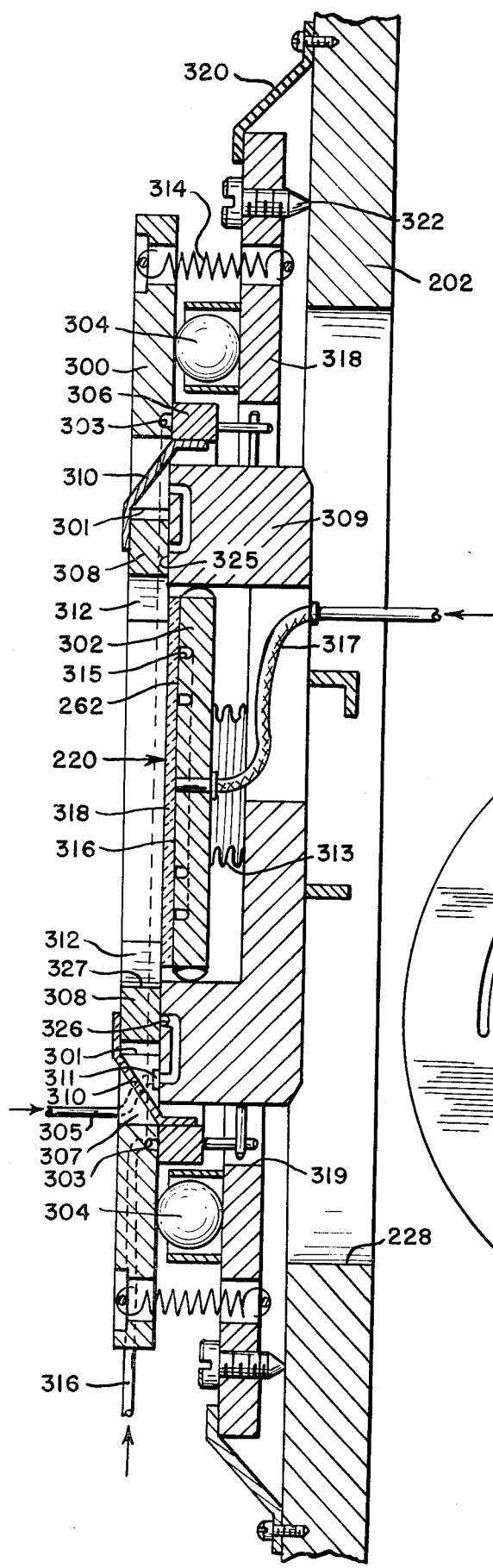
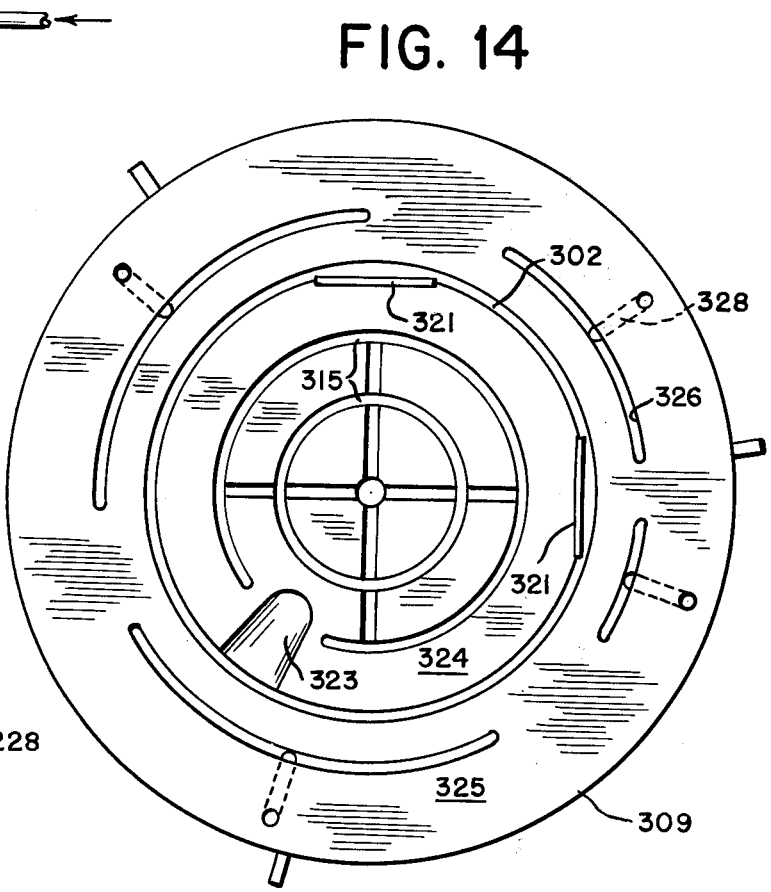
FIG. 13
FIG. 14

OPTICAL PROJECTION AND SCANNING APPARATUS

This is a continuation of application Ser. No. 339,860, filed Mar. 9, 1973, now abandoned.

The present invention relates to photography in its broadest sense, and more particularly to an apparatus and method for exposing a light-sensitive object to a succession of light images in closely controlled relative positions on the object.

In one application the invention finds use in the manufacture of so-called integrated circuits. These are typically small plates or "chips" of silicon on which a number of electric circuit elements, such as resistors, transistors, and leads therefor have been disposed or manufactured in situ, producing a plurality of interconnected circuit elements, i.e. a circuit. The chips may be very small, of linear dimensions of the order of millimeters, and the number of circuit elements may be large, of the order of scores or of hundreds. As one step in the manufacture of such integrated circuits, an oxidized wafer of silicon is coated with a photo-resist material. The wafer may be of such dimensions that after processing it may be cut, for example along rows and columns, into a large number of chips. When exposed to light, the photo-resist material polymerizes into a hard tenacious coating, whereas the unexposed portions of the layer are readily removed, for example by means of a solvent or developer. Photo-resist materials reacting in the opposite way are also available. By means of a "mask" or "master" which is opaque except for a pattern of transparent lines and areas therein through which light can pass, the photo-resist coating is exposed to light in a pattern conforming to a circuit element or elements to be produced (or to a part of such circuit), or to a photographic reverse thereof. The mask typically bears a multiplicity of the same pattern arranged in rows and columns. The mask may be laid against the wafer, much as in the making of a contact print in photography. Alternatively an image of the mask may be projected by image-forming means onto the surface of the wafer as in projection printing. After removal of the unexposed portion of the photo-resist layer, additional processing steps involving etching, doping and the like, not constituting part of the invention, result in the formation of conductive leads and/or of semi-conductive circuit elements such as transistors or diodes, on the portion of the surface of the wafer from which the photo-resist coating has been removed. To form additional circuit elements or portions thereof, the process may be repeated by the laying down on the wafer of a new photo-resist coating and repetition of the steps just outlined. By means of a different mask, the wafer with the new photo-resist coating is exposed to a different light image for the polymerization of the photo-resist coating in a different pattern on its surface. The optical images formed on the wafer in the successive exposures must however be closely controlled in relative position.

Apparatus for performing the steps outlined in the preceding paragraph exists in the prior art. All such apparatus known to the present application is however subject to a number of disadvantages. One is the fact that in such prior art apparatus wherein the mask and wafer are not in contact or substantially in contact with the other, there are employed projection lenses made up of refractive elements for imaging the complete mask on the wafer. These lenses are expensive and cumbersome, especially when, as is desirable, they are color corrected at two widely spaced wavelengths, one for purposes of alignment of the mask and the wafer, and the other for effecting exposure of the photo-resist coating.

According to the invention an illumination source and an imaging system, preferably of catoptric type and preferably of unit magnification, are disposed in fixed relative position, and (for each exposure) the mask and wafer are supported in adjustably fixable relative position. A carriage supports one of these pairs of structural elements for motion with respect to the other so that the mask and wafer may be scanned, by motion parallel to their own planes, through conjugate planes of the imaging system. The source illuminates a selected area in the object plane of the imaging system where the latter possesses optimum imaging properties, and the motion of the carriage effects a scan of the mask through this illuminated area. In this way, a high quality image of a large mask is obtained on a large wafer, larger than that area of optimum imaging properties. By control of the speed of the scanning motion and/or of the width, parallel to the direction of that motion, of the area illuminated on the mask, control of exposure times is obtained. According to another feature of the invention, the imaging system includes a combination of plane mirrors which gives an image of the mask on the wafer in the same form as that which characterizes contact printing in photography. Fine motion mechanisms permit accurate adjustment of the mask and wafer relative to each other, and the imaging system is used in conjunction with additional optical elements to permit visual examination of the mask and wafer during alignment by means of these mechanisms, the examination being effected with light which does not photographically expose the wafer.

BRIEF DESCRIPTION OF THE DRAWINGS

The invention, including the features thereof abovementioned and others, will not be further described in terms of a presently preferred exemplary embodiment with reference to the accompanying drawings, in which:

FIG. 10 is a fragmentary view in elevation of the apparatus shown in FIG. 9, seen in the direction of the arrows 10—10 in FIG. 9;

FIG. 11 is a fragmentary sectional view taken on the line 11—11 in FIG. 9, shown together with a sectional view of the means in the carriage which define the plane of the mask;

FIG. 13 is a diagrammatic sectional view of the wafer stage in the carriage of FIG. 1;

FIG. 14 is a view in elevation of the platen and platen carrier, seen in section in FIG. 13, which support the wafer during positioning and exposure;

DESCRIPTION OF PREFERRED EMBODIMENT

Figure 1:
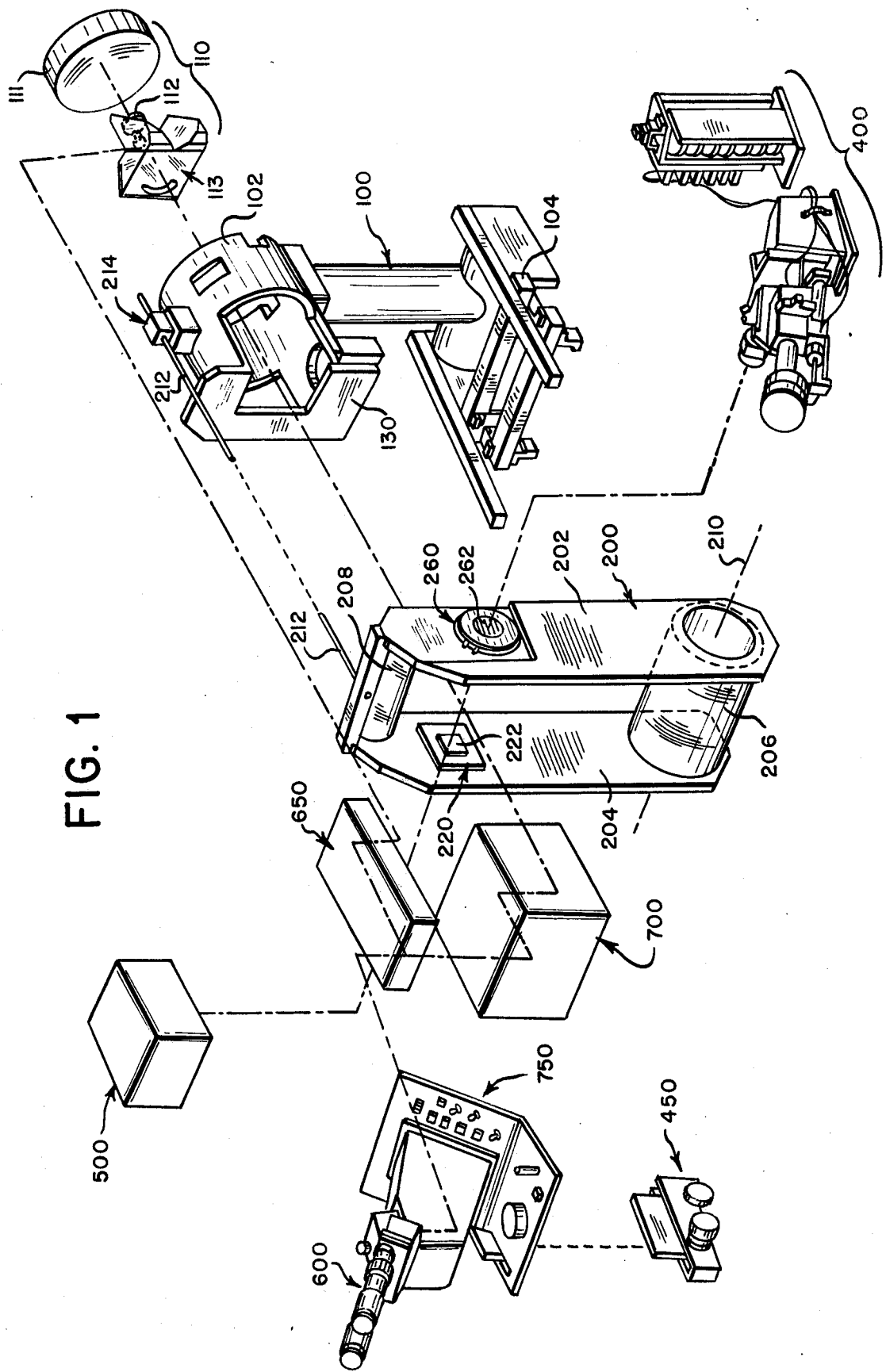
FIG. 1 is an exploded view of an optical projection and scanning machine in accordance with the invention, partly in block diagram form.

In FIG. 1 a machine in accordance with the invention is illustrated in exploded form. The machine includes a frame, not shown, in which the components seen in FIG. 1 are mounted, some fixedly and others movably. In particular, the machine includes a stationary pedestal 100 having a generally cylindrical head 102 inside which is mounted a unity magnification catoptric image-forming system 110. Catoptric systems suitable for use in the apparatus of the present invention are the subject of U.S. Pat. No. 3,748,015 granted on the copending application of Abe Offner Ser. No. 154,948 filed on June 21, 1971 and assigned to the assignee hereof.

The machine of FIG. 1 further includes a carriage 200 pivotally mounted on the pedestal 100 for rotation with respect thereto. The carriage supports the mask and wafer for a scanning motion together with respect to the image-forming system 110 and an illumination system 500 by means of which exposure is effected. The system 110 forms on the wafer an image of the portion of the mask defined by an illuminated slit which constitutes part of a stationary illumination system. The illumination system is diagrammatically illustrated in FIG. 1 at 500.

The carriage includes a mask stage 220 and a wafer stage 260 which are independently movable in finely controlled increments with respect to the carriage by means of mechanism illustrated in FIGS. 9 to 16.

The wafers are inserted in and removed from the stage 260 by means of a handling mechanism 400, the details of which constitute no necessary part of the present invention. The masks are similarly insertable into and removable from the mask stage 220 by mechanism of which a portion is diagrammatically indicated at 450 and the details of which again constitute no necessary part of the present invention.

Figure 5:
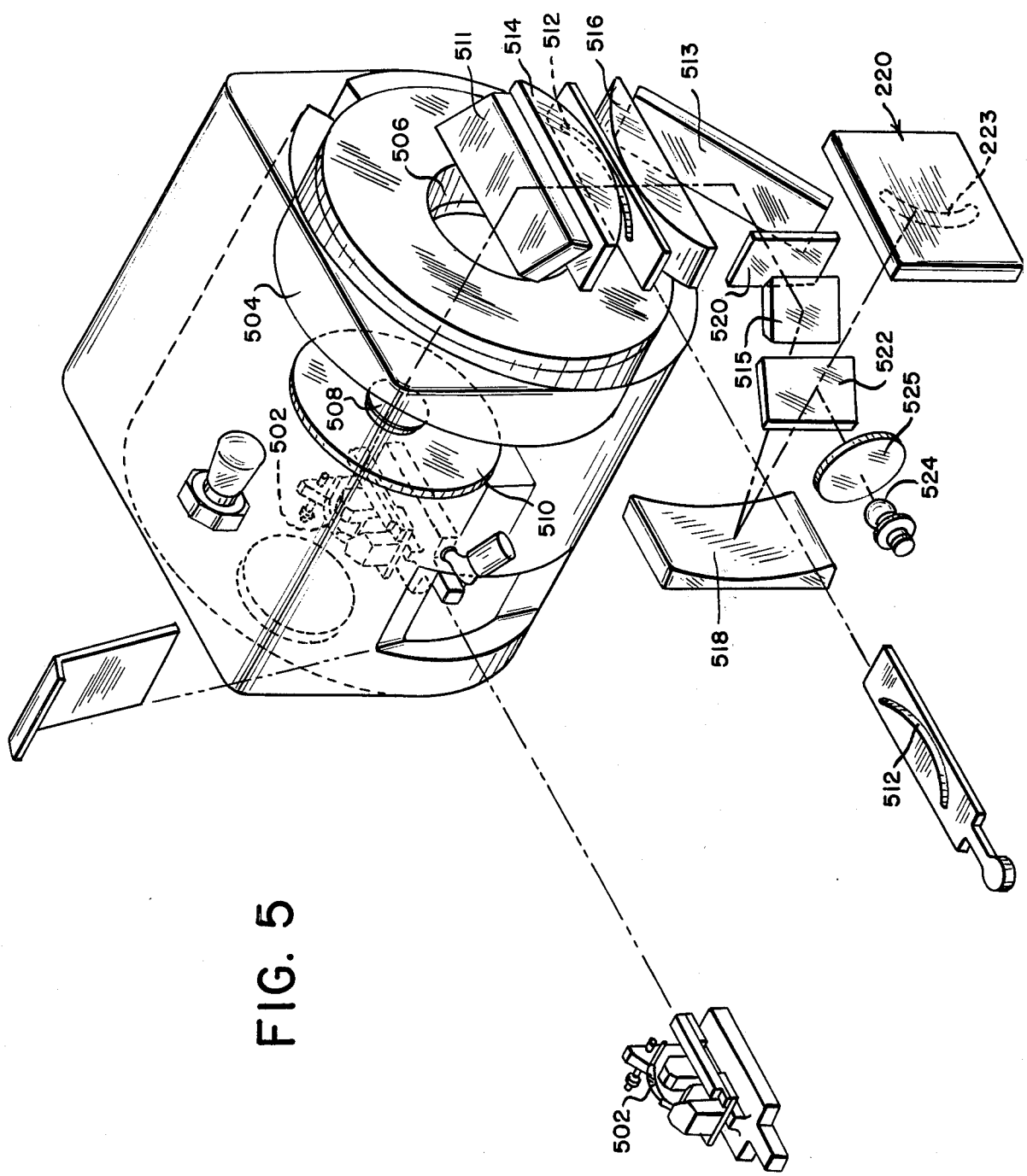
FIG. 5 is an isometric view of one form of illumination system which may be utilized in the machine of the invention for illuminating the mask.

The mask 222 in the stage 220 is illuminated by the illumination system 500, details of one suitable form of which are shown in FIG. 5. The illumination system also serves via the optical system 110 to illuminate the wafer 262 in the wafer stage 260, so as to permit correct positioning of the wafer with respect to the image of the mask projected onto it before the exposure is made. The actinically effective radiation for the exposure is in the ultraviolet and in the short wavelength portion of the visible, and the positioning is effected by means of visible light from which the actinic radiation has been removed.

Figure 3:
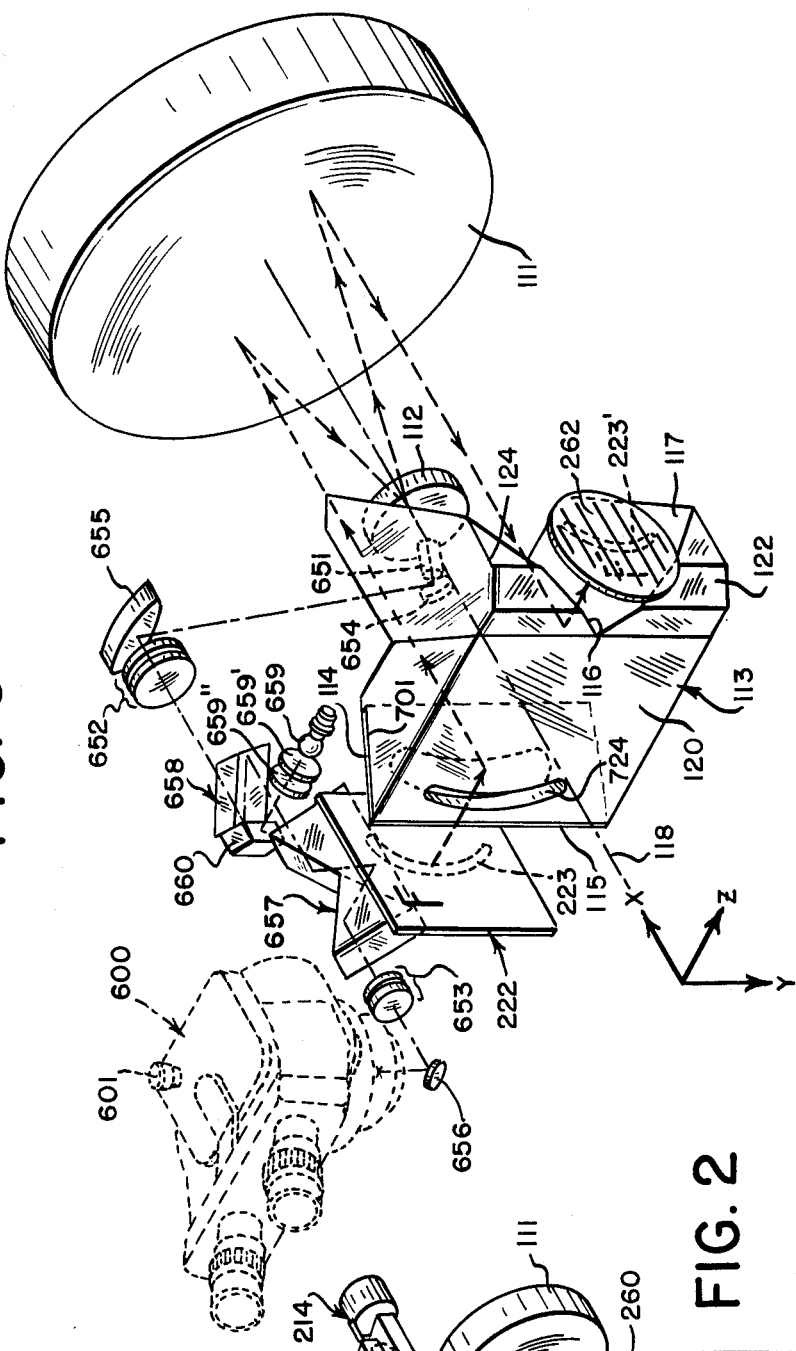
FIG. 3 is a diagrammatic view of the catoptric projection optical system, showing in addition the coarse viewing system by means of which the mask and wafer are initially positioned with respect to each other in the carriage.

To permit achievement of proper positioning of the mask and wafer in the carriage by means of their respective stages, the wafer and the image of the mask formed on the wafer by the optical system 110, are examined by optics which include the optical system 110 itself, a binocular variable magnification microscope eyepiece 600, and certain additional elements, some of which are indicated diagrammatically in FIG. 1 at 650 and others at 700. The elements 650 and certain cooperating elements shown in FIG. 3 provide a relatively low magnification view of the mask and wafer, while the elements 700 permit a higher magnification view, as will be explained with reference to FIGS. 3 and 4.

Figure 2:
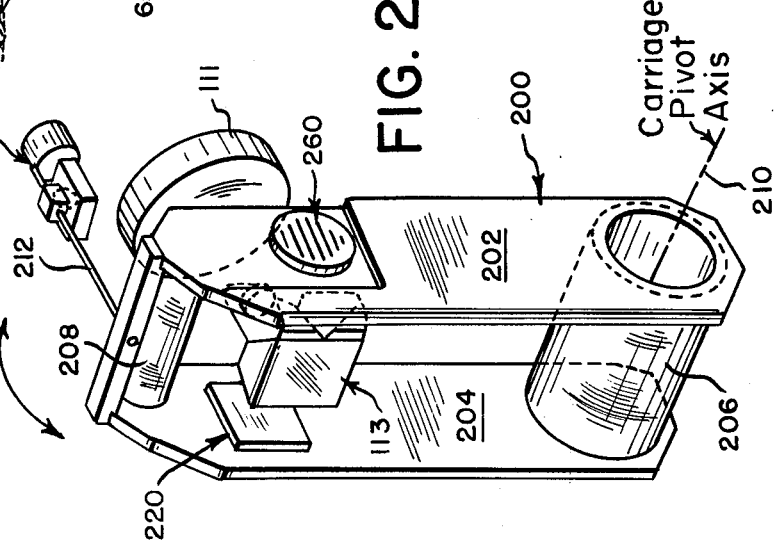
FIG. 2 is a diagrammatic isometric view of the carriage which, in the machine of FIG. 1, supports the mask and wafer during the exposure or exposures, the carriage being shown in operative positional relation with the catoptric projection optical system by means of which an image of the mask is projected onto the wafer.
Figure 8:
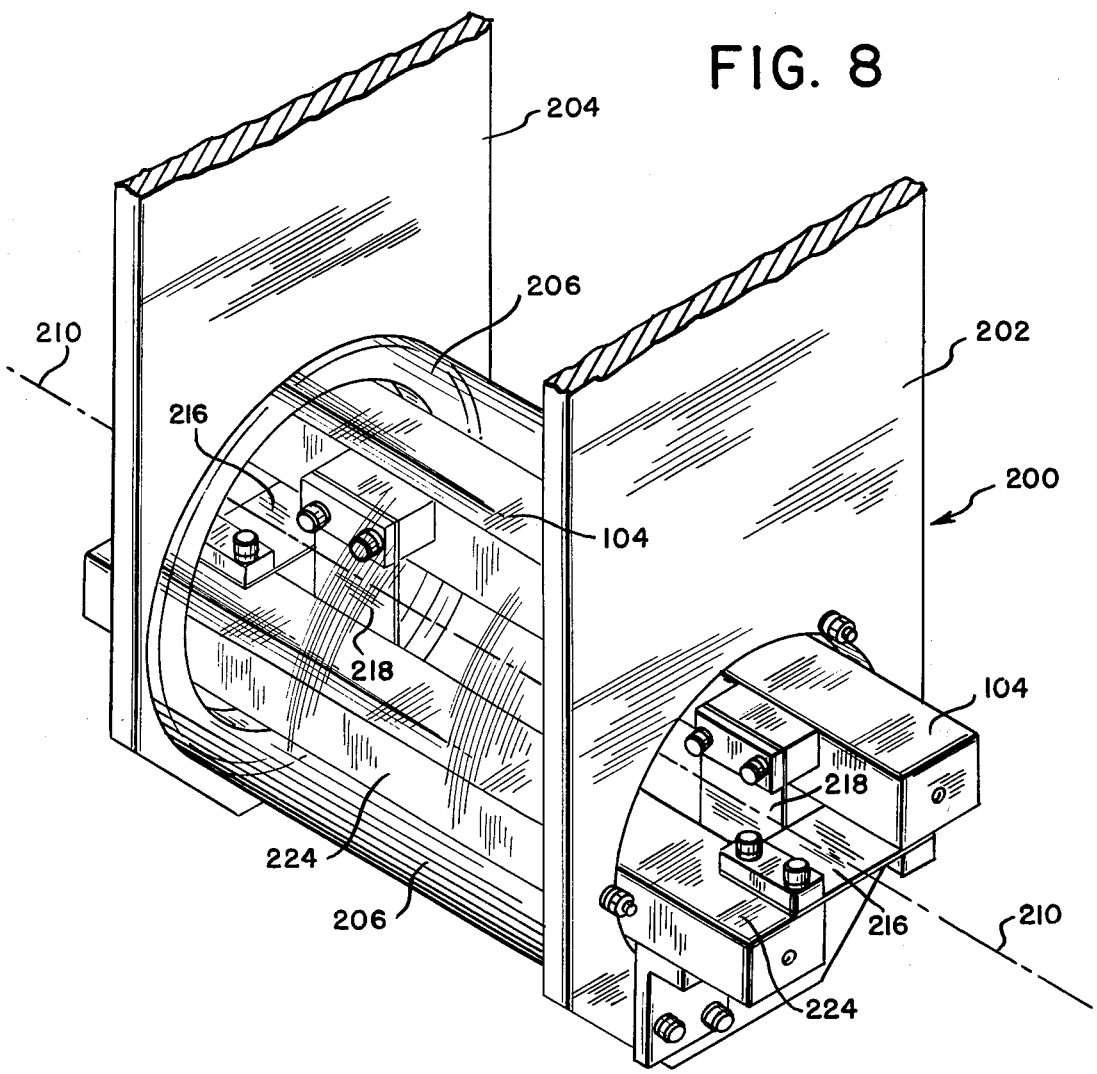
FIG. 8 is a fragmentary isometric view of the carriage of FIG. 1, illustrating a preferred flexure-type bearing support therefor.

Referring to FIGS. 2 and 8, the carriage includes two parallel metallic side plates 202 and 204 held together by means of glass cylinders 206 and 208. The carriage is mounted for arcuate rotation about a pivotal axis indicated at 210 which is located on or near the axis of the cylinder 206. The rotation is effected by means of a push rod 212 which connects to a friction drive mechanism 214 disposed on the cylindrical head 102. The friction drive mechanism, as well as the other movable portions of the machine involved in its operation, such as the mask and wafer stages 220 and 260 and the wafer and mask handling mechanisms 400 and 450, are under the control of an operator who has at his disposition the microscope eyepiece 600 and a set of associated controls indicated at a control panel 750.

The carriage is supported from a bar 104 on the pedestal 100 by means of two pairs of crossed flexure blades 216 and 218 (FIG. 8) which connect to a bar 224 affixed to the side plates of the carriage. The use of flexure-type supports on the carriage assists in obtaining accurate alignment of the axis of carriage rotation in parallelism with lines connecting points on the mask with their respective conjugate image points formed on the wafer by the optical system 110. Since only a relatively small angular motion is required of the carriage to carry the mask and wafer across the illuminated area defined by the illumination system, such flexure-type supports can be used.

Figure 12:
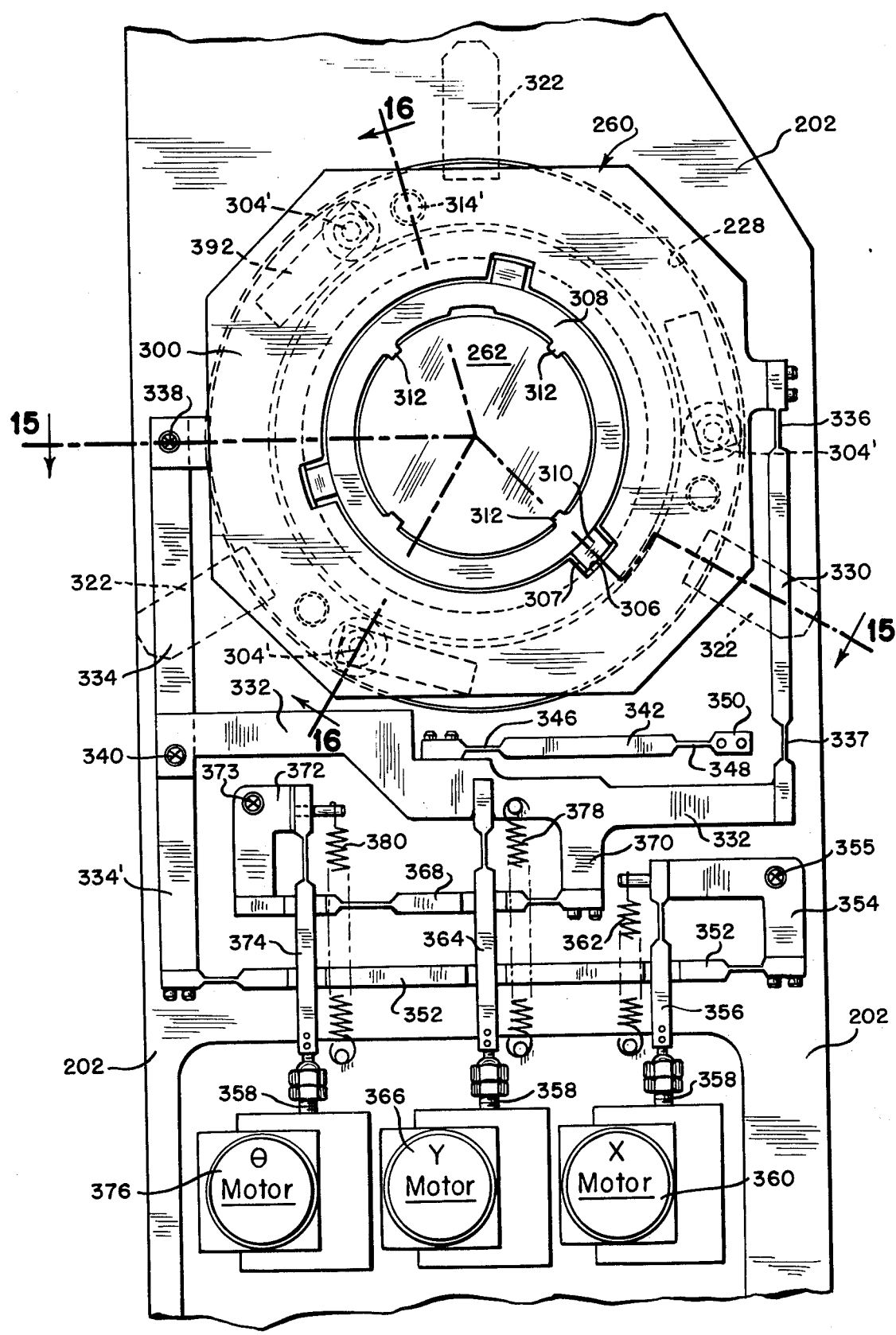
FIG. 12 is a view in elevation of the wafer stage in the carriage of FIG. 1, showing mechanism by means of which even more closely controlled translational and rotational motions may be imposed on that stage.

The side plates 204 and 202 of the carriage are apertured as indicated at 226 in FIG. 11 and at 228 in FIG. 12, and the stages 220 and 260 support the mask and wafer over these apertures.

Figure 9:
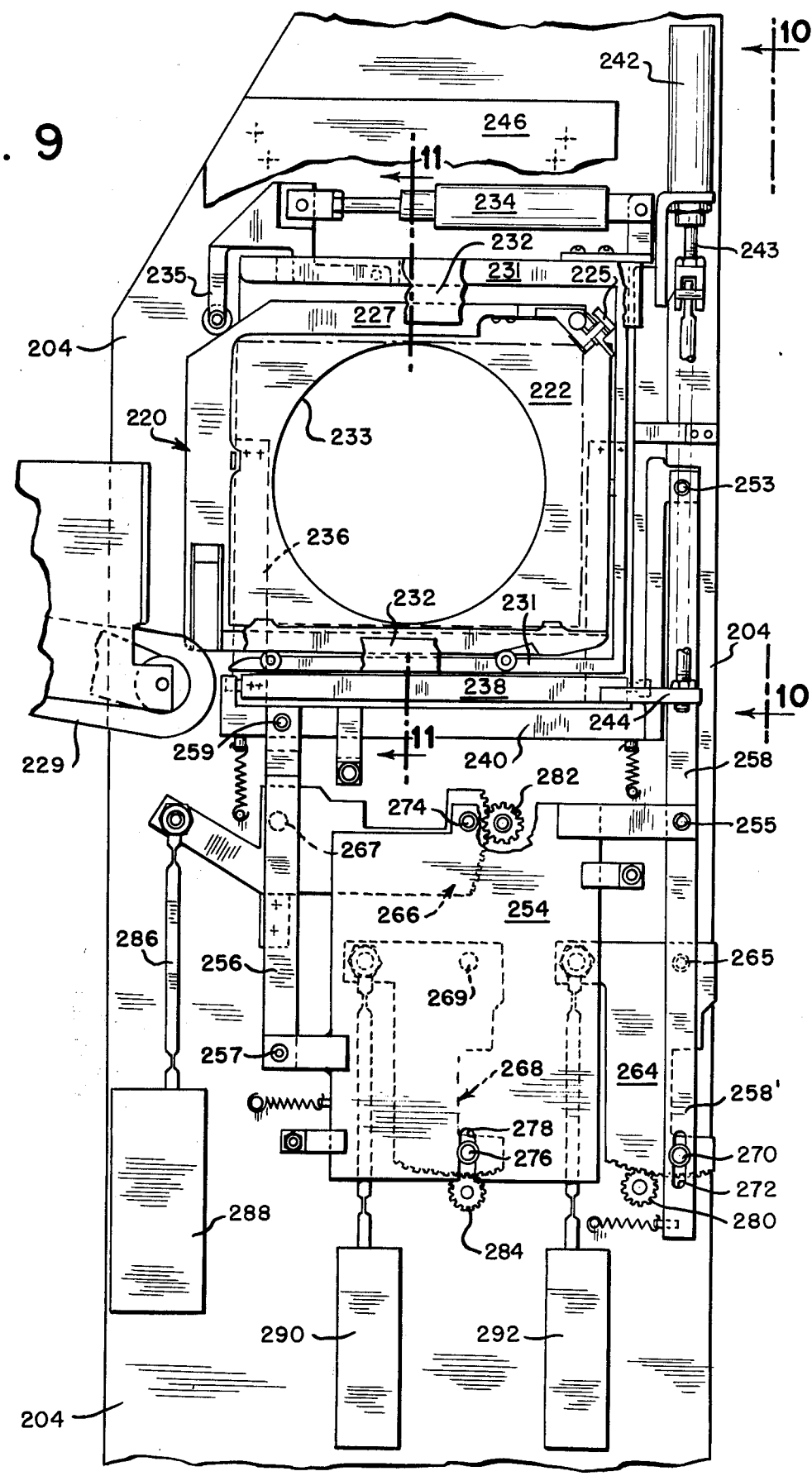
FIG. 9 is a diagrammatic view in elevation of the mask stage in the carriage of FIG. 1, showing the mechanism for imposing closely controlled translational and rotational motions on that stage.

The mask stage and motion will be described first, referring to FIGS. 9 to 11. FIG. 9 is a partial view in elevation of the plate 204 of the carriage as seen from a location between the plates 202 and 204.

The mask 222, typically a glass plate with a partly opaque and partly transparent pattern laid down thereon, is held by means of a thumb screw 225 in a frame 227 which can be inserted into and removed from the machine. Mechanism for this purpose, not forming part of the carriage, is diagrammatically illustrated as a belt 229 in FIG. 9. The belt 229 belongs functionally to the mask handling mechanism 450 of FIG. 1.

The frame 227 with its mask is removably received in a vertically disposed tray 231 having retaining flanges 232. The tray is open at the left (as seen in FIG. 9) to receive the mask in its frame and it has an aperture 233 in the side thereof, i.e. on the side of the mask remote from the observer looking at FIG. 9. A piston 234 affixed to the tray and coupled through a flexible line, not shown, to a source of hydraulic or pneumatic pressure, actuates a finger 235 to stress the mask frame 227 against position-defining stops in the tray so as to locate the mask with respect to the tray and hence, as subsequently described, with respect to a bar 240, presently to be described, which constitutes one element of a parallelgram motion mechanism. The bar 240 may for convenience be called the mask carrier.

The tray 231 is coupled through flexure joints 230 (FIG. 11) to two fork tines 236 which are seen in phantom in FIG. 9. The tines are rooted in a rocking lever 238, pivoted in the bar 240 for rotation about a substantially horizontal axis.

A piston 242 (FIGS. 9 and 10) is affixed to a vertical extension of the bar 240 and connects through a flexible conduit, not shown, to a source of pneumatic or hydraulic pressure. The piston rod 243 of this piston couples to an extension 244 of the lever 238. When the piston rod is forced downwardly, the tines 236 are swung to the left in FIG. 11 and shift the tray 231 with its mask until the mask brings up against the rim 239 of a position-defining member 246 (seen fragmentarily in FIG. 9) which is fixed to the carriage side plate 204 and which is seen in FIG. 11. This rim may be circular in shape and corresponds substantially to the location of the aperture 226. It leaves exposed the pattern-bearing portion of the mask for illumination from outside the carriage, i.e. to light passing from the illumination source toward the left in FIG. 11 through the aperture 226 in the plate 204 and through the mask. A vacuum groove 248 is provided in this rim and when the mask has been properly located with respect to the carriage by the motion mechanism of which the bar 240 is a part, application of vacuum to this groove locks the mask in position with respect to the carriage. The rim 239 lies in the object focal plane of the image-forming system 110 of FIG. 1. This plane is perpendicular to the axis of rotation 210 of the carriage. Hence positioning of the mask, with its pattern bearing surface against the rim 239, insures that the image of that portion of the mask instantaneously illuminated by the source 500 (in a manner presently to be described) will be formed at unity magnification in an image focal plane adjacent the carriage side plate 202 and in which the photo-resist bearing surface of the wafer is caused to lie.

The mask carrier bar 240 constitutes part of a parallelogram motion mechanism by means of which the mask can be moved independently in perpendicular X and Y directions, and also rotated, in planes parallel to the object focal plane defined by the rim 239 of the position-defining member 246. This parallelogram motion mechanism includes in addition to the bar 240, a plate 254 and two links 256 and 258. These are pivoted together at pivots 253, 255, 257 and 259. The spacing from 253 to 255 is the same as the spacing from 259 to 257 and the spacing from 259 to 253 is the same as the spacing from 257 to 255. Three gear sectors 264, 266 and 268 are pivoted to the plate 204 at 265, 267 and 269. A pin 270 on sector 264 engages an extension 258' of link 258 at a slot 272 in that extension. A pin 274 couples sector 266 to plate 254, and a pin 276 on sector 268 engages the plate 254 at a slot 278. Separate motors, not shown, disposed on the side of plate 204 not seen in FIG. 9 and selectively controlled from the panel 750 of FIG. 1, rotate pinions 280, 282 and 284 which mesh with sectors 264, 266 and 268 respectively.

Plate 254 and hence the parallelogram comprising that plate, bar 240 and links 256 and 258, is coupled to plate 204, i.e. to "ground", through pivot 274 and sector 266. With pinions 282 and 284 stationary, plate 254 is stationary and rotation of sector 264 rotates link 258 about a stationary pivot at 255. Link 256 therefore rotates about a stationary pivot at 257, and bar 240 with the mask stage executes parallel motion along an arcuate circular path. For the small excursions required however, this motion is essentially horizontal in FIG. 9 and hence can be referred to as an X motion for the mask. With pinions 280 and 284 stationary, the lower end of line 258 is constrained at pin 270 and slot 272 and the lower end of plate 254 is constrained at pin 276 and slot 278. Hence rotation of pinion 282 and sector 266 imposes on plate 254 a motion which is primarily an up and down motion in FIG. 9, and this is communicated, again as an essentially up and down or Y motion, to bar 240 and thereby to the mask. With pinions 280 and 282 stationary rotation of sector 268 by pinion 284 imposes on the plate 254 a rotation about a stationary pivot at 274. This rotation is permitted by the slot 272 which moreover constrains link 258, so that this rotation of plate 254 is duplicated as a rotation of bar 240, and thereby of the mask, about a center in the mask. This motion can accordingly for convenience be referred to as an angular or $\theta$ motion.

A link 286 connects the sector 266 to a position sensing and/or limit switch device 288, and the sectors 268 and 264 are similarly coupled to position sensing and/or limit switch devices 290 and 292.

Figure 4:
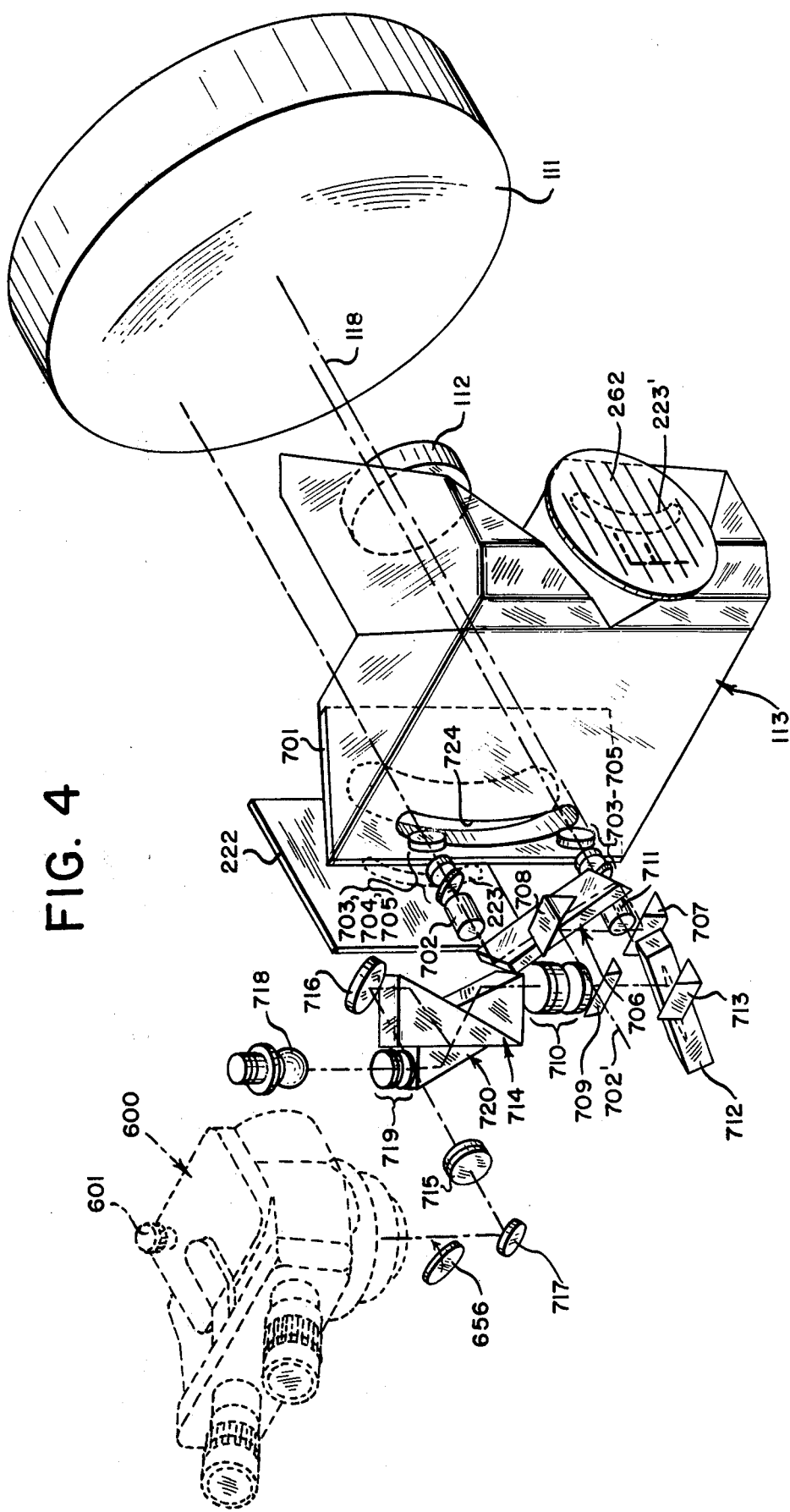
FIG. 4 is a view similar to that of FIG. 3, but showing instead of the coarse viewing system the fine viewing system by means of which the mask and wafer are accurately positioned with respect to each other in the carriage.

The purpose in providing X, Y and $\theta$ motions for the mask is to make it possible to position reference marks on the mask within the widely spaced half fields of two microscopes shown in FIG. 4 which make up the fine viewing system employed to control accurate positioning of the wafer with respect to the image of the mask projected onto it by the imaging system 110.

The wafer stage and motion mechanism will be described next. The position of the wafer must be more closely controlled than that of the mask. Especially when wafers are to be subjected to exposures subsequent to the first one, they must be very exactly positioned, so that the successive exposures will be in the correct relative positions. The wafer stage is therefore constructed to permit highly accurate positioning of the wafers.

FIG. 12 is a fragmentary view in elevation of the carriage plate 202, seen from the space between the plates 202 and 204. In FIG. 12 the wafer 262 is shown supported over the aperture 228 in plate 202, by elements of structure to be described in connection with FIG. 13, at the center of an apertured plate 300 which constitutes one link of a parallelogram motion mechanism, capable of imposing independent closely controlled X, Y and $\theta$ motions on the wafer.

The support of the wafer from the plate 300 is most readily understood from a consideration of the diagrammatic representation of FIG. 13. In that figure the wafer 262, supported on a platen 302, is seen stressed by a bellows-type spring 313 against radially inwardly extending lugs 312 of an inner adapter ring 308. The inner adapter ring is supported by a plurality of radially and axially extending springs 310 from an outer adapter ring 306. The springs 310 are accommodated in notches 307 in the inner periphery of plate 300. The outer adapter ring 306 rests against the exterior face of the plate 300 about and spaced radially outwardly from an aperture 301 therein, and is held in that position by a vacuum groove 303 in that outer surface of the plate 300, connecting to a flexible vacuum line 316.

The plane of the exterior surface of the plate 300, in which lies the surface of the wafer 262 bearing the photo-resist coating, is brought to lie in the image focal plane of the imaging system 110 by adjustment (with respect to the carriage side plate 202) of an outer ring 318 on which the plate 300 rides at ball bearings 304. Springs 314 hold the plate 300 against these balls and hold the balls against the outer ring 318. The outer ring 318 is supported for adjustment with respect to the carriage side plate 202 by means of springs and screw-type adjustments diagrammatically indicated at 320 and at 322. Presently preferred forms for these screw-type adjustments, and for the ball bearing supports of plate 300 from ring 318, will be described in connection with FIGS. 15 and 16. By manipulation of the screw-thread adjustments diagrammatically indicated at 322, the left-hand surface of the wafer 262, coplanar with the right-hand face of plate 300, can be brought to lie in the image focal plane at which the imaging system 110 produces a unit magnification image of the mask. Thereafter the plate 300 and wafer may be adjusted translationally and rotationally by the parallelogram motion mechanism seen in the lower portion of FIG. 12 without removing the surface of the wafer from that image focal plane.

Three adjusting means as diagrammatically indicated at 322 in FIG. 13 are disposed 120° apart about the aperture 228 in the carriage side plate 202. Similarly, three ball bearing supports as diagrammatically indicated at 304 are disposed 120° apart about the aperture 319 in the outer ring 318.

Figure 15:
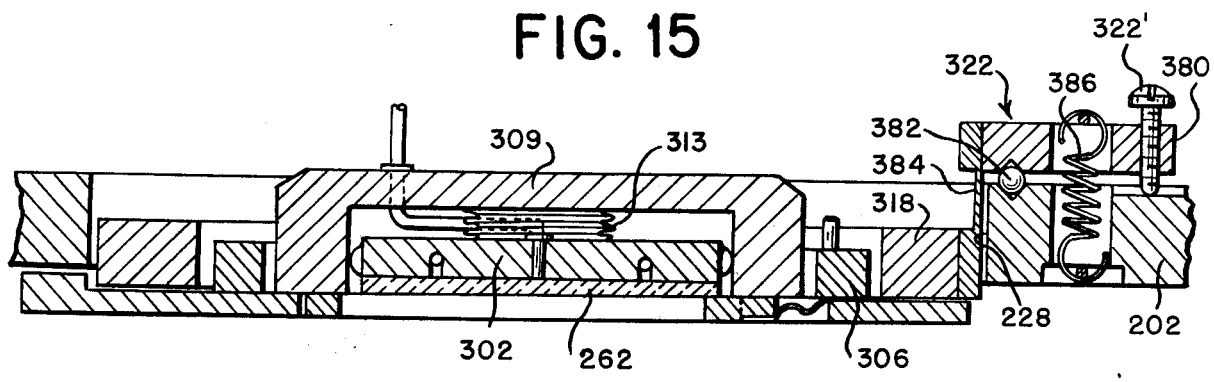
FIGS. 15 and 16 are sectional views taken on the lines 15—15 and 16—16 of FIG. 12.

FIG. 15 is a sectional view showing the adjustable support means 322 of the outer ring 318 from the carriage plate 202 according to a presently preferred construction. A lever 380 is coupled to a ball 382 which provides a fulcrum between the lever and the carriage plate 202. The short end of the lever connects through a flexure blade 384 to the outer ring 318, which is of diameter to fit within the hole 228 in the carriage plate 202. A tension spring 386 stresses the long end of the lever 380 toward the carriage plate, to an angular position defined by a screw which can be adjusted from outside the carriage. To distinguish it from the functionally similar but mechanically, differentially arranged screw 322 of the diagrammatic showing of FIG. 13, this screw of FIG. 15 is identified by the reference character 322'. Three of these screw-thread flexure adjustments are provided, disposed equiangularly about the periphery of the outer ring 318, and by adjustment thereof the plane of that ring can be brought into parallelism with the plane conjugate in the optical system 110 to the plane occupied by the mask on the opposite side of the carriage. The adjustment is performed for best focus of the image of the mask on the surface of the wafer 262, as observed in the binocular microscope eyepiece 600.

Figure 16:
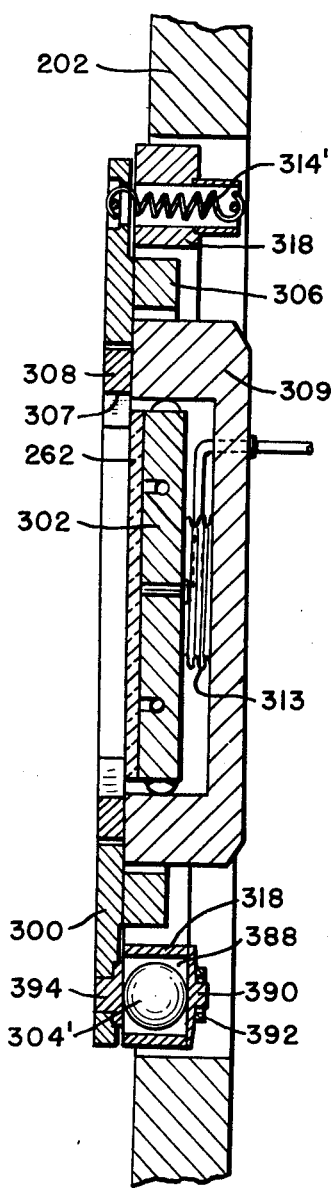

FIG. 16 shows a similarly presently preferred construction for the support of the plate 300 from the outer ring 318. At three points equiangularly spaced about its center, the outer ring is pierced with a hole 388. The hole is closed on the side toward the exterior of the carriage by a cover 390 which is stressed by a leaf spring 392 against the outer face of the ring. The hole thus closed constitutes a cage for a ball identified at 304'. The ball has a diameter slightly greater than the thickness of the ring 318, and the plate 300 is stressed against each of the three balls at a hardened seat 394 by means of a tension spring 314', weaker than the spring 392, and positioned circumferentially adjacent the ball as indicated in FIG. 12. The plate 300 is thus free to move parallel to the outer ring 318 through the small excursions linearly and angularly which are necessary for alignment of the mask and wafer.

The adapter rings 306 and 308 constitute an assembly by means of which, according to the size of the opening 327 in the inner ring 308, the machine may be set to accept wafers of various sizes.

Wafers of any given size are supported on a suitably dimensioned platen 302 which in turn is supported by a platen carrier 309. The platen is supported within a central cylindrical cavity in the platen carrier by means of a compression spring 313 which, when unstressed, defines for the left-hand face of the wafer a rest position beyond the left-hand face of the platen carrier as seen in FIG. 13. The surface of the platen is provided with vacuum grooves 315 which connect via a flexible line 317 to a source of vacuum not shown. The platen includes stops 321 extending above its surface and against which flats on the edge of the wafer may be brought to rest when the wafer is applied to the platen for processing, in order to effect an initial orientation of the wafer in angular position. The platen is provided with a shallow cut-out 323 below the plane surface 324 thereof to facilitate handling of the wafer as by tweezers in applying and removing it from the platen.

The platen carrier 309 is provided with a smooth face 325 adapted to bear against the right-hand face of the plate 300 as seen in FIG. 13, and also against the right-hand face of the inner adapter ring 308. The springs 310, when unstressed, define for that inner adapter ring a rest position which locates the right-hand face of the inner adapter ring to the right of the right-hand face of the plate 300.

As shown in FIGS. 13 and 14, the platen carrier includes vacuum grooves 326 positioned to engage against the right-hand face of the inner adapter ring 308 in FIG. 13. Axially and radially extending bores, indicated at 328 in FIG. 14, communicate with the vacuum grooves 326 and mate with circumferentially interrupted vacuum grooves 311 on the right-hand surface of plate 300 between the radially extending notches 307 therein. The vacuum grooves 311 connect with a vacuum line 305, which is separate from the vacuum line 316 connecting to vacuum groove 303.

The handling mechanism 400 of FIG. 1 manipulates the platen carrier 309 with its platen, and in particular applies it to and removes it from the wafer stage. In applying a platen carrier whose platen is loaded with a wafer to the wafer stage, the mechanism 400 delivers the carrier with motion to the left, in the view of FIG. 13, moving the wafer 262 into engagement with the legs 312 on the inner adapter ring 308. The springs 310 and 313 are dimensioned so that the platen 302 and the wafer thereon have for horizontal motions a greater compliance with respect to the platen carrier 309 than has the inner ring 308 with respect to the outer ring 306 of the adapter assembly. Consequently, when the handling mechanism delivers the loaded platen carrier to the left, the wafer after engagement at the legs 312 recedes with the platen into the platen carrier until the face 325 of the platen carrier brings up against the right-hand face of the inner adapter ring 308. The ring 308 is thereupon forced to the left until the face 325 of the platen carrier also engages the right-hand face of the plate 300. At this stage vacuum is applied to line 305 in plate 300. The platen carrier, platen and wafer are therefore locked in position transversely of the carriage with the left-hand surface of the wafer (in FIG. 13) coplanar with the right-hand surface of the plate 300, but free to move under influence of the parallelogram motion mechanism illustrated in FIG. 12, the surface of the wafer remaining in its own plane.

Referring to FIG. 12, the plate 300 constitutes one side of a four-armed parallelogram mechanism similar to that shown in FIG. 9. The other links of the parallelogram comprise a link 330, a bar 332, and a bar 334. The link 330 is joined at its ends to the plate 300 and to the bar 332 by means of flexure pivots 336 and 337 respectively. The bar 334 is coupled to the plate 300 and to the bar 332 at pivots 338 and 340 which may take the form of crossed flexure blades, similar to those shown at 216 and 218 in FIG. 8 although of smaller size. The spacing of 338 from 340 is the same as the spacing from 336 to 337, and the spacing from 336 to 338 is the same as the spacing from 337 to 340. At or near its mid-point, the bar 332 is coupled to ground, i.e. to the plate 202, through a link 342 having flexure pivots 346 and 348 at its ends, the latter connecting to a block 350 anchored to the plate 202.

An extension 334' on the bar 334 connects via link 352, similar to the link 342, with a bell crank 354 pivoted at 355 to the plate 202. A push rod link 356 couples the bell crank 354 to the linearly movably actuating rod 358 of a motor 360. A spring 362 coupled between the bell crank 354 and the plate 202 stresses the bell crank toward counterclockwise motion, as seen in FIG. 12.

A push rod link 364 couples the bar 332 to the actuating rod 358 of a second motor 366. A link 368, similar to the link 342, couples the bar 332 at an extension 370 thereof with a bell crank 372 pivoted to the plate 202 at 373, and a push rod 374 couples the bell crank to a third motor 376. Springs 378 and 380 respectively draw the bar 332 downwardly and impose a clockwise stress on the bell crank 372.

With the motors 366 and 376 stationary, the bar 332 corresponding to the plate 254 of FIG. 9 is held stationary also. Motion of the motor 360 shifts link 352 horizontally, thereby rotating link 334 about a stationary pivot at 340. This imposes on the plate 300 a parallel arcuate motion which for the small excursions involved is essentially a horizontal motion in FIG. 12 and which can therefore be described as an X motion for the wafer. With motors 360 and 376 stationary, motion of the motor 366 imposes on the plate 300 an essentially linear motion which is vertical as seen in FIG. 12, and which can therefore be described as a Y motion. With motors 360 and 366 stationary, motion of the motor 376 imposes on the plate 300 a rotational motion which can therefore be described as an angular or $\theta$ motion.

Position sensors and/or limit switches, similar to the devices 288, 290 and 292, may be provided in association with the push rods 364, 374 and 356. Like the motors which rotate the pinions 280, 282 and 284 of FIG. 9, the motors 360, 366 and 376 of FIG. 12 are selectively controlled from the panel 750 of FIG. 1.

The illumination system by means of which a selected portion of the area of the mask is illuminated is illustrated in FIG. 5. The illumination system includes as a source a mercury capillary lamp 502 of arcuate shape, a concave primary mirror 504 apertured at 506, and a convex secondary mirror 508 supported on a plate 510 of suitably transparent material capable of passing both the visible and ultraviolet light produced by the lamp.

An arcuate image of the lamp 502 is formed by the mirrors 504 and 508 (and with the aid of a plane mirror 311) at the plane of an arcuate slit 512 disposed between field lenses 514 and 516. These lenses are segments of plano-convex spherical lenses. The illumination system is so disposed that the illuminated slit at 512, as reimaged by plane mirrors 513 and 515 and by a spherical mirror 518, appears in the plane of the mask, and more particularly in the plane in which the surface of the mask near the reader in FIG. 3 is moved on the carriage as described in conjunction with FIGS. 9 to 11. The fraction of the mask thus illuminated is indicated at 223 in FIG. 5. The arcuate illuminated area 223 is fixed in position with reference to the image-forming system 110. The system 110, shown in FIG. 1 and further described below, includes a primary concave mirror 111, a convex secondary mirror 112, and a combination of plane reflecting mirrors, generally indicated at 113. The area 223 constitutes an extra axial object for the image-forming system 110 in accordance with the teaching of the aforementioned U.S. Pat. No. 3,748,015 to offer above referred to, and for that extra object the system 110 possesses optimum correction, again as disclosed in the aforementioned Offner patent.

To permit accurate adjustment in the position of the wafer without exposing it photographically, there is provided a filter 520 removably insertable into the light path by the operator with the aid of a control on the front panel 750. When inserted into the light path, as shown in FIG. 5, this filter prevents the ultraviolet light which has passed through slit 512 from reaching the mirror 518 and mask 222. This filter is removed from the optical path just before carriage motion is initiated, to effect exposure after correct positioning of the mask and wafer.

For positioning of the mask and for coarse positioning of the wafer, illumination is desired over substantially the entire surface of the wafer and of the mask rather than at a narrow arcuate shaped portion of that area. For this purpose, there is provided a movable opaque mirror 522 which is similarly under control of the operator to be removably interposed in the light path downstream of the slit 512. A lamp 524, generating little or no ultraviolet radiation to which the wafer would be actinically responsive, is disposed in position to illuminate the mask, with the aid of a condensing lens 525, when the mirror 522 is in the position shown for it in FIG. 5.

The imaging of the mask at the wafer is illustrated in FIG. 3. The mask 222 as a whole (when broadly illuminated by the lamp 524 of FIG. 5) or a narrow arcuate slit-shaped area 223 thereof defined by the illuminating system proper, is imaged on the surface of the wafer 262 nearest it with the help of the optical system 110. The components of this system are a primary concave mirror 111, a secondary convex mirror 112, and a mirror array 113. The mirrors 111 and 112 are advantageously constructed in accordance with the disclosure of the application Serial No. 154,948 hereinabove identified. Thus the mirrors 111 and 112 are concentric, and the secondary mirror 112 is advantageously given a radius of curvature slightly greater than one-half the radius of curvature of the mirror 111, so as to achieve high quality imagery over an extra-axial zone which is caused to coincide with the illuminated slit-shaped area 223. The array 113 may be made from three blocks of glass 120, 122 and 124, suitably shaped and assembled. The array is provided with a reflecting face adjacent the mask 222, and the plane of this face is identified in FIG. 3 by the intersecting edges 114 and 115. This plane is inclined at 45° to the selected common axis of symmetry 118 of mirrors 111 and 112.

For reasons to be explained in connection with FIG. 4, the reflecting face just mentioned desirably takes the form of a dichroic coating of high reflectivity in the ultraviolet and of approximately 50% reflection and 50% transmission in the visible. This coating is formed on a thin glass plate 701 affixed to the block 120, which is cut away as indicated at 724 for purposes pertaining to the fine viewing system to be described in conjunction with FIG. 4.

By reflection at the face of plate 701, light from the mask 222 is reflected into the primary mirror 111, whence it is reflected to the secondary mirror 112, back to the primary mirror 111, and thence once more to the array 113. To achieve on the wafer 262 an image of the mask having the same orientation to the mask itself as that which characterizes the orientation of a photographic print to the photographic negative from which the print is made in a contact print, the array 113 is provided with a pair of mutually perpendicular reflecting plane faces 116 and 117. The faces 116 and 117 constitute a "roof", in the terminology of prisms, and the line of intersection of the roof surfaces is perpendicular to the plane face of plate 701 defined by the edges 114 and 115. This line of intersection is also inclined at 45° to the axis 118. Faces 116 and 117 may be fully mirrored.

Mirrors 111 and 112 may be spherical. The combination of concave mirror 111 and convex mirror 112 provides a unity magnification optical system. For objects optically distance from the mirror 111 substantially by the radius of curvature thereof, the optical distance from the mirror 111 to the image position is then likewise substantially equal to that radius of curvature. In accordance with the disclosure of the aforementioned Offner patent, the combination of mirrors 111 and 112 is worked at unity magnification but off-axis, to permit separation of image and object, and also to achieve improved image quality within an annular extra-axial zone. Consequently in presently preferred embodiments of the machine of the present invention, the object and image focal planes occupied by the mask 222 and wafer 262 are nominally, except in consequence of deviation of the optical path by reflections at the array 113, in the plane through the common center of curvature of mirrors 111 and 112 which is perpendicular to the axis 118. The array 113 is therefore spaced from mirrors 111 and 112 by distances less than their radii of curvature so as to throw the unity magnification conjugate planes of the combination out to opposite sides where the mask 222 and wafer 262 may be located.

Figure 17:
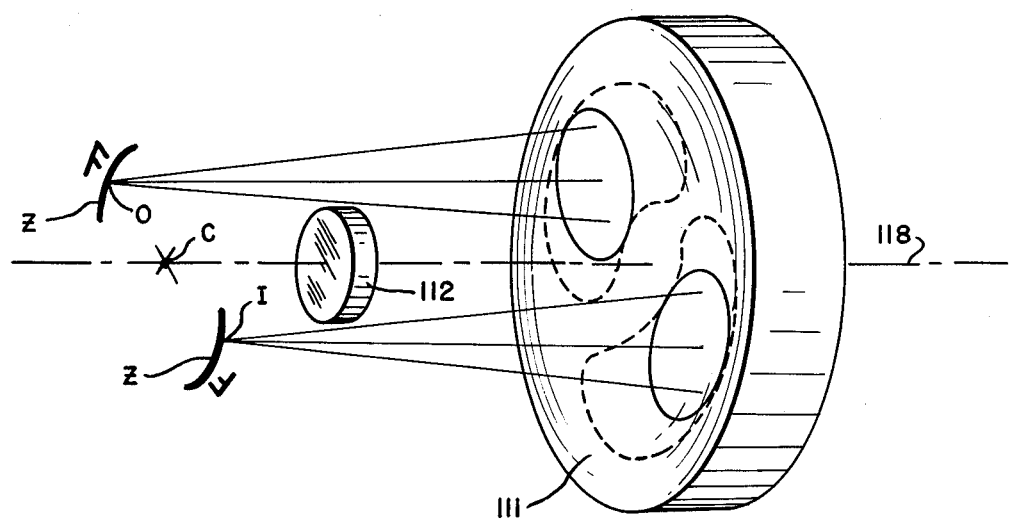
FIGS. 17 and 18 are two diagrams useful in explaining the catoptric projection optical system employed in the invention.
Figure 18:
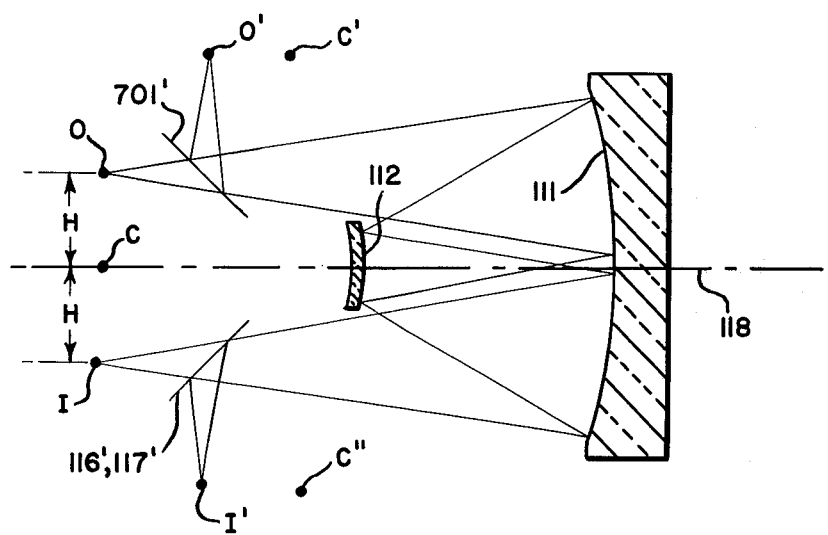

This construction is illustrated in FIGS. 17 and 18. FIG. 17 is a diagrammatic perspective view of the mirrors 111 and 112 alone and FIG. 18 is a sectional view of those mirrors in a plane containing their common center of curvature C, with a simplified representation of the mirror array 113. In both figures, O is an object point distant from the mirror 111 substantially by its radius of curvature R, and I is the image of O as successively formed by the mirror 111, by the mirror 112, and by the mirror 111 a second time. The object and image points O and I lie in a plane passing through the center of curvature C, and the perpendicular to this plane through C is the axis 118 of FIGS. 3 and 4. O and I are both distant from C by a distance which may be called H. In FIG. 17 there have been drawn arcuate lines Z of radius H in the plane containing O and I which is perpendicular to the axis 118. In accordance with the disclosure of the Offner patent, improved imagery is achieved in the combination of mirrors 111 and 112 for object points optically distant from the axis 118 by the distance H by giving to the convex reflecting surface of the mirror 112 a radius which is approximately $R/2 + H^2/4R$, R being, as before, the radius of curvature of the concave spherical reflecting surface of the mirror 111. This relation is desirably incorporated into the sizing of mirrors 111 and 112 in the machine of the invention. In other words, if the mean radius of the arcuate area 223 in FIG. 3 is H, and if the radius of mirror 111 is R, the radius of mirror 112 is $R/2 + H^2/4R$. In FIG. 18 the plane reflecting mirror formed by the plate 701 of FIGS. 3 and 4 is schematically indicated at 701', and the combination of the plane reflecting faces 116 and 117 is indicated at 116', 117'. The image of the object point O in the mirror 701' is indicated at 0', and the image in that mirror of the center of curvature C is indicated at C'. The image of the image point I in the mirror combination 116', 117' is indicated at I', and the image in that combination of the center of curvature C is indicated at C''. The points O' and C' are separated by the distance H, and so are the points I' and C''. In the machine of the invention being described, the illumination system of FIG. 5 and the image-forming system 110 are so coordinated in their dimensions that the mean radius H of the arc to which the arcuate illuminated area 223 of FIG. 3 conforms matches at least approximately the dimension H according to which the radius of curvature of the mirror 112 is oversized in accordance with the relation just set forth. The illumination system of FIG. 5 and the image-forming system 110 are moreover positioned with respect to each other so that the center of curvature of the arcuate area 223 coincides at least approximately with the point identified as C' in FIG. 18, this being in the machine the image in the mirror 701 of an object point separated by the distance H from the axis 118 of the system 110. The mask and wafer are caused to lie in planes perpendicular to the plane of FIG. 18, and containing in the case of the mask the points O' and C' of FIG. 18, and in the case of the wafer the points I' and C'' of FIG. 18.

With the construction of the system 110 and its coordination to the location of the mask and wafer and to the dimensions and location of the arcuate illuminated area 223 which have been described, the machine of the invention provides at the plane of the wafer 262 away from the reader in FIG. 3, a high quality image at unity magnification of an object lying in the face of the mask 222 near the reader in FIG. 3. More particularly, such a high quality unity magnification image is provided for an object lying within the extra-axial arcuate area indicated at 223 on that surface of the mask in accordance with the disclosure of the Offner patent.

The orientation to each other of the object and image achieved in this imaging system 110 with the help of the "roof" faces 116 and 117 is indicated in FIG. 3 by the application of the upper case letter F to the near face of the mask 220 and to the far face of the wafer 262. This is the contact print orientation above referred to. It has the advantage that it is compatible with the arcuate and therefore rotational motion which the carriage imposes on the mask and wafer. It has the additional advantage of being compatible with other processes or process steps employing contact printing.

After the mask and wafer have been properly positioned with respect to each other in the carriage, with the aid of the coarse and fine viewing systems next to be described, the operator of the machine of FIG. 1 programs the machine for an exposure, with the aid of one of the controls on the panel 750. This shifts the carriage 200 to one end of its travel, drawing the mask and wafer respectively out of the illuminated area 223 of FIG. 5 and out of the image of that area produced by the imaging system 110. The lamp 524 of FIG. 5 is shut off and the filter 520 and mirror 522 are removed. The carriage then rotates through its travel, exposing successive portions of the mask to illumination over the stationary arc-shaped area 223 and thereby exposing successive portions of the wafer to the image of those successively illuminated portions of the mask.

In order properly to position the mask and wafer with respect to each other in the carriage by operation of the positioning mechanisms which have been described in connection with FIGS. 9 and 12, it must be possible to observe the mask and wafer alignments. The mask is observed by observation of the image thereof projected by the optical system 110 onto the surface of the wafer. This image, and the wafer itself, are observed by means of coarse and fine viewing systems.

The coarse viewing system provides a view of the image of the entire mask and of the entire wafer at once, or at least of a major fraction of each, and is also illustrated in FIG. 3. Referring to that figure, the image of the mask at the wafer produced by the image system 110 (i.e. by reflecting face of plate 701, by the mirrors 111 and 112 and by the reflecting faces 116 and 117) and also the wafer itself, are examined with the aid of an optical system which comprises successively the roof surfaces 116 and 117, the primary mirror 111, three sets of relay lenses 651, 652 and 653, and finally the binocular eyepiece 600 together with the plane mirrors 654, 655 and 656 and a number of additional elements to be mentioned presently. To permit functioning of the coarse viewing system, the secondary mirror 112 of the unity magnification imaging system 110 is provided on its convex surface adjacent to the mirror 111 with a dichroic coating have a high reflectivity in the ultraviolet and, desirably, a reflectivity of some 50% and a transmission of some 50% in the visible. A prism 658 is included to fold and shorten the light path. A derotating prism 657 is inserted to permit presentation of the image to the observer in a suitably oriented azimuthal position. To permit illumination of the wafer in a color contrasting with that in which the image of the mask is presented by the lamp 524 of FIG. 4 and any filter which may be associated with it, a lamp 659 with an associated condensing lens 659' and filter 659" is positioned to illuminate a prism 660 attached to the prism 658 and having a beam-splitting surface therein. Light from the lamp 659 thus passes successively to the relay lens combinations 652 and 651, through the mirror 112 and to the mirror 111, and thence via reflecting faces 116 and 117 to illuminate the wafer 262.

The binocular eyepiece may be of variable magnification type, with a zoom control 601.

The mirror 522 of FIG. 5 may be made thin and partially transparent enough to permit some light from the source 502, filtered at 520 and refocused by the mirror 518, to pass it. The area 223 on the mask will then be illuminated more brightly than the remainder of the mask, and a corresponding bright arcuate area 223' will appear on the wafer.

For viewing of fine detail in the mask image at the wafer and in the wafer itself, there is provided a fine viewing system illustrated in FIG. 4. The image of the mask at the wafer and the wafer itself considered as objects (and more particularly the portions of those objects lying within the area 223' on the wafer, which area is itself the image on the wafer of the illuminated area 223 on the mask), are reimaged backward successively at the reflecting faces 116, 117, mirror 111, mirror 112 and mirror 111 again. Selected portions of the resulting aerial image are examined with the aid of two movable microscope objectives in conjunction with the eyepiece 600. Instead however of examining such an aerial image in the plane of the mask itself, there is examined the aerial image formed by the fraction of the backwardly travelling light from the mirror 111 which passes through the plane reflector 701. More particularly, two microscopes permit examination of two portions controllably spaced along the arcuate area 223' on the surface of the wafer away from the reader in FIG. 4.

For this purpose, the glass block 113 has cut therethrough an arcuate slot 724, extending substantially parallel to the axis 118 from the near face of the block in FIG. 4 to the face of the block on which the plate 701 is affixed. The aerial image of interest of the area 223' is arcuate in shape, with its center of curvature substantially on the axis 118, lies substantially in a plane perpendicular to that axis and is near the opening of aperture 724 at the near face 120 of glass block 113 in FIGS. 3 and 4. Two microscope objectives 702 and 711 are provided, supported on arms (not shown) which are pivoted substantially on the axis 118 and of such length as to align those objectives with the arcuate slot 724. Supported with each objective 702, 711 are three plates 703, 704 and 705, suitably tilted about the axis of the objective to compensate for the aberrations introduced into the image presented to that objective by the convergent passage through the tilted plate 701 of light on its way to formation of that image. Supported near the objective 702 on its arm is a prism 706 to bring the axis of objective 702 down to the axis 118. After two reflections in prism 706 and two further reflections at stationary path folding mirrors 707 and 708, the image of the fraction of the object 223' at the wafer selected by objective 702 is formed in the vicinity of a further plane mirror 709. Mirror 709 selects half of this image and diverts it into one-half of the field of a field lens 710.

A second objective 711 with associated tilt-plate 703, 704 and 705, and a prism 712 movably mounted on the second arm bring to the axis 118 light representative of another selected part of the area 223'. This light is deviated at a fixed mirror 713 into the other half of the field lens combination 710.

The objectives 702 and 711 thus each contribute an image of a semi-circular area along the arcuate object 223'. The two half fields so combined are presented to the operator in the eyepiece 600, after passage through an azimuthal angle selecting prism 714, a relay lens 715, and deviation at mirrors 716 and 717. A lamp 718 and associated lens and filter combination 719 and combining prism 720 make it possible to illuminate the semi-circular areas on the wafer, along the length of the area 223′, in a visible color contrasting with that of the lamp 502 and filter 520 of FIG. 5.

It is to be understood that the instrument of FIG. 1 includes the components of both of FIGS. 3 and 4. Those figures both show the imaging system 110, the mask 220 and the wafer 262, and also the eyepiece 600. FIG. 3 shows further the additional elements which, with the system 110 and eyepiece 600, make up the coarse viewing system for examination of the wafer and of the image of the mask cast upon the wafer by the system 110 itself. FIG. 4 shows further the additional elements which, with the system 110 and eyepiece 600, make up the fine viewing system for examining selected portions of the wafer and of the image of the mask so cast upon it. Selection between the coarse and fine viewing systems is made with the mirror 656, which is movable and which is shown in both of FIGS. 3 and 4. It is disposed, as seen in FIG. 4, between the mirror 717 of the fine viewing system and the eyepiece 600. When mirror 656 is inserted into the path for light entering the eyepiece, the coarse viewing system is optically completed and the fine viewing system is disabled.

The mirror array provided by glass block 113 must be susceptible of closely controlled positional adjustments in order to permit achievement of that array with the pivot axis 210. For this purpose, the array is supported from the pedestal 100 of FIG. 1 in the manner illustrated in FIG. 6. The head 102 of the pedestal includes a plate 130, shown in FIG. 1, oriented vertically and perpendicular to the axis 118. The mirror array 113 is affixed to a plate 131, parallel to plate 130, by three flexure links 132, 133 and 134 which accommodate the different thermal expansions and contractions of the array and plate. The plate 131 in turn is coupled to the plate 130 by means which permit small closely controlled motions of the plate 131 and hence of the array 113 with respect to the plate 130 and hence with respect to the head 102 of pedestal 100 in which the mirrors 111 and 112 are fixedly mounted, by means not shown.

These coupling means include two flexure links 135 and 136 at right angles to each other, connected between short brackets 137 attached to plate 131 and struts 138 affixed to plate 130. Links 135 and 136 limit rotations of the plate 131 in its own plane to rotations about the point of intersection C of those links in FIG. 6, on or near the axis 118 of FIGS. 3 and 4. The construction is such that this point C is located approximately at the common center of curvature of the mirrors 111 and 112.

The coupling means additionally include two flexure links 139 and 140 disposed substantially in a vertical plane containing the axis 118, links 139 and 140 being respectively above and below that axis. Link 139 is fastened at one end to plate 130 and at the other end to the plate 131 through an adjustable flexure device 141. Link 140 is fastened at one end to plate 130 and at the other end to plate 131 through a fixed bracket 142.

The coupling means further include a flexure link 143 at the lower end of plate 131 fastened at one end to plate 130 via a strut 146 and at the other end to plate 131 through an adjustable flexure device 145.

The coupling means lastly include a flexure link 146, fastened at one end to plate 130 and at the other end to plate 131 through an adjustable flexure device 147. The link 146 is horizontally displaced from the vertical line in which links 139 and 140 are disposed.

Figure 6:
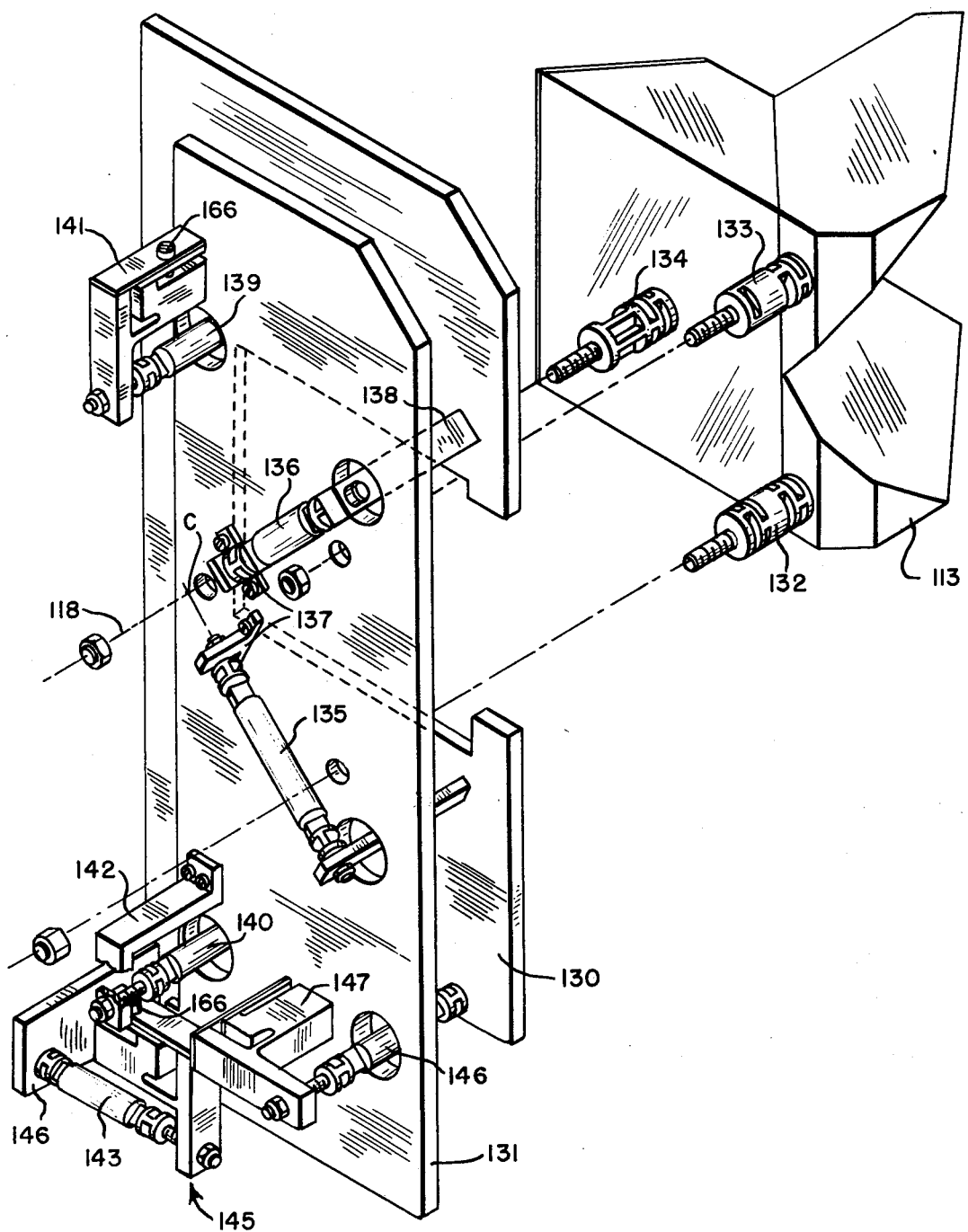
FIG. 6 is a diagrammatic view of a preferred mechanism for adjustable stationary support of a mirror array forming part of the catoptric projection optical system.
Figure 7:
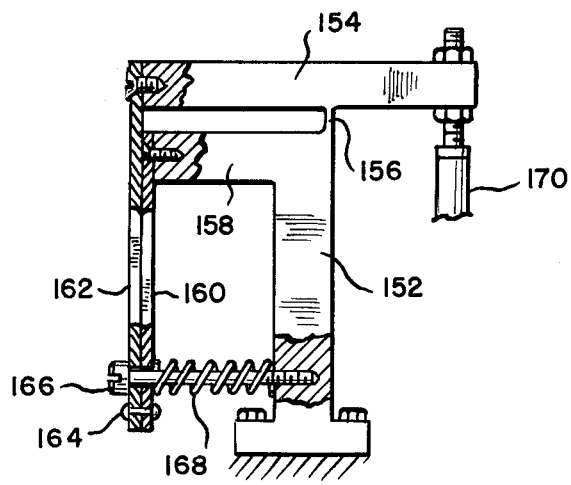
FIG. 7 is a view of a flexure device for imposing minute motions used in the apparatus of FIG. 6.

The adjustable flexure devices 141, 145 and 147 are of the type illustrated in FIG. 7, and permit closely controlled minute backlash free motions. Adjustment of the device 145 at its screw 166 rotates the plate 131 in its own plane about a center substantially on the axis 118. Adjustment of the device 147 at a similar screw not visible in FIG. 6 rotates plate 131 about a vertical axis in or near the plate and passing through or near the links 139 and 140. Adjustment of device 141 at its screw 166 rotates plate 131 about a horizontal axis substantially in the plane of the plate and passing through or near the links 140 and 146.

Adjustments of devices 145 and 147 constitute two adjustments which are orthogonal, i.e. non-interferring, and which are required to make parallel to the axis of rotation 210 of the carriage (FIG. 8) lines joining conjugate object and image points in the mask 222 and wafer 262. Since the two rotations produced by adjustment of the flexure devices 145 and 147 are both about the center of curvature C, neither causes a change in focus. The third adjustment, of device 141, causes an arcuate translation of the array 113 and thereby adjusts the focus, i.e. the length of the optical path from mask to wafer via the system 110, of which the array 113 is a part.

As seen in FIG. 7, each of the flexure devices 141, 145 and 147 includes a stem 152 to which a lever 154 is connected through a flexure joint 156. The stem 152 has affixed thereto an arm 158, extending transverse of the stem and parallel to the lever 154. A first flexure blade 160 is affixed to the arm 158, extending parallel to the stem 152. A second flexure blade 162 overlies the blade 160. The blade 162 is connected at one end to one end of the lever 154 and is bound at the other end as by a rivet 164 to the blade 160. A screw 166 passes with clearance through the blades 160 and 162, and is threaded into the stem 152. A compression helical spring 168 is engaged about the screw 166 between the stem 152 and the blade 160.

The blade 160 when screw 166 is turned in is pinned to the arm 158 of the stem. Adjustment of the screw 166 imposes a varying curvature on the blades 160 and 162, with the blade 162 having a greater or lesser radius of curvature than the blade 160 according as the screw 166 is advanced to the right or left as seen in FIG. 8. Since the two are pinned together at the lower end FIG. 7, the blade 162 will slide at its upper end by a minute amount relative to blade 160, and this motion is transferred by the beam 154 to an output, indicated in FIG. 7 as a link 170. In FIG. 6 the stems of the flexure devices 141, 145 and 147 are affixed to plate 131.

In the operation of the machine, a mask is loaded onto the mask stage 220 with the aid of the mechanism 450 (FIG. 1) and a wafer is loaded manually onto the platen and platen carrier 309 in the loading mechanism 400, which mechanism is accessible to the operator. By operation of a control on the front panel 750, the loaded platen and platen carrier are then transferred from the mechanism 400 to the wafer stage 260 in the carriage. Vacuum line 305 (FIG. 13) is activated, pulling the wafer into focus against the inner adapter ring 308.

With the carriage in a central position of its angular travel, the coarse viewing system is activated by insertion of mirror 522 and lighting of lamp 524 in FIG. 5, and by insertion into the optical path of the eyepiece of the mirror 656 in FIG. 3. The linear and angular motion controls on the front panel are then first connected to the mask stage drive motors which drive the pinions 280, 282 and 284 in FIG. 9 to permit correct alignment of the mask. In the eyepiece 600 the operator sees at one level of illumination either the image of the whole mask on the wafer or, in any event, most of it. Superimposed thereon he sees at a higher level of illumination the arcuate area 223, and at a still higher level of illumination he sees two semi-circular or "D-shaped" areas which are spaced along the length of the arcuate area 223 according to the angular positions of the microscope objectives 702 and 711 about the axis 118 in FIG. 4. The objectives can be adjusted angularly about this axis with the aid of a front panel control, and for this initial alignment they are desirably positioned near the ends of their travel, as they are shown in FIG. 4. The operator manipulates the controls on the mask stage drive motors as required to position within each of the D-shaped areas at least one of a number of alignement marks which are distributed over the surface of the mask.

Transferring the front panel mask stage motion controls to the wafer stage drive motors 360, 366 and 376 of FIG. 12, the operator may make preliminary adjustments on wafer position while viewing the surface of the wafer through the coarse viewing system of FIG. 3. He then changes over the fine viewing mechanism of FIG. 4 and further adjusts the wafer position in X, Y and Θ motions, so as to achieve accurate alignment of the mask alignment marks previously set with corresponding alignment marks on the wafer and which are seen one in each of the two semi-circular fields simultaneously presented to him at the eyepiece 600.

By operation of a further front panel control, the carriage is rotated to a start position at which the mask and wafer are withdrawn outside the illuminated areas 223 at the mask plane and 223' at the wafer plane. The filter 520 and mirror 522 are then withdrawn from the optional path of FIG. 5 and the carriage is rotated to carry or "scan" the mask and wafer across illuminated areas 223 and 223', the direction of scan being transverse to the length of those areas.

The machine may incorporate structure for insuring that the foregoing steps are performed in the correct order and with any convenient degree of automation compatible with the requirements for correct positioning of the mask and wafer.

It will thus be seen that the invention provides apparatus for photographically exposing an image-receiving surface (a wafer) to a light image of an object (a mask). The apparatus comprises a concave mirror (111), a convex mirror (112) of smaller radius of curvature with its center of curvature substantially at the center of curvature of the concave mirror, and separate stages to support substantially plane object and image surfaces (the mask and wafer) optically disposed in a common plane containing that center of curvature. This is set forth in connection with FIGS. 17 and 18. From those figures it will be seen that the mask and wafer occupy planes which are images, in the mirror 701' and in the mirrors 116' and 117' respectively, of a plane containing the center of curvature C of the concave and convex mirrors, an object point O distant from the concave mirror substantially by the radius of curvature of the latter, and containing also the image I of that object point in the concave and convex mirrors. The mask and wafer are therefore disposed optically, although not physically (in the embodiment shown in the drawings) in the plane containing the arcuate lines Z of FIG. 17, which past-mentioned plane contains the center of curvature C and is perpendicular to the axis 118. The apparatus of the invention also includes, in the illumination system of FIG. 5, apparatus to illuminate in the plane of the object surface (i.e. of the mask) an arcuate area 223 which is exterior to and substantially centered on the axis 118 as produced (by reflection at mirror 701) to the mask plane. Lastly, in its broadest aspects, the apparatus of the invention includes means, such as the carriage 200, to advance the object (the mask) in its plane through that illuminated arcuate area and to advance the image-receiving surface (the wafer) in its plane through the image of that illuminated arcuate area. These means may of course move the mask and wafer with respect to the mirrors 111 and 112, or alternatively the mirrors 111 and 112 (with the mirror array 113, in the embodiment illustrated) and the illuminating system 500 may be moved with respect to the mask and wafer to effect such advance.

In the presently preferred embodiment which has been illustrated and described, the apparatus of the invention further includes, in the reflecting array 113, two plane reflecting means which are positioned between the concave and convex mirrors 111 and 112 and their center of curvature. In the embodiment illustrated, one of these plane reflecting means takes the form of the mirror 701 and the other takes the form of the plane mirrors 116 and 117 together. These two reflecting means are inclined to each other at substantially 90° and each is inclined to the axis 118 at substantially 45°. In consequence of this construction and disposition of the mirror array 113, the unity magnification conjugate object and image planes in which the wafer and mask are disposed are parallel to each other and to the axis 118.

According to a further feature of the invention, the mirror array 113 includes, as the second of these two plane reflecting means, the two perpendicular plane mirrors 116 and 117 instead of a single plane mirror matching the mirror 701. The plane mirrors 116 and 117 are inclined to each other at 90°. They are equally inclined to the mirror 701, and their line of intersection is inclined at 45° to the axis 118. In fact, the planes of the mirrors 116 and 117 are each inclined at 30° to the axis 1B.

Provision of the "roof" mirrors 116 and 117, and the consequent inversion top for bottom of the mask image as formed at the wafer plane, permits the use according to a preferred embodiment of the invention of a carriage for the mask and wafer which is pivoted about an axis (210 in FIG. 8) fixed with respect to the optical system 110. Hence the mask and wafer undergo arcuate motion in their travel through the unity magnification conjugate planes of the system 110.

According to still another feature of the invention, one of the plane reflecting means by which the mask and wafer planes are thrown out into parallelism with each other as indicated in FIG. 18, instead of lying in a common plane as indicated at the arcuate lines Z in FIG. 17, is made partially transparent. This is the case for the mirror 701 in the embodiment illustrated. According to this feature, there are then additionally provided means to examine the image of the wafer surface produced by the concave and convex mirrors as that image is transmitted through the partially transparent mirror 701. These means for examination take the form, in the embodiment illustrated, of the fine viewing mechanism illustrated in FIG. 4 and described in conjunction with that figure. In a preferred embodiment, namely that which has been described and illustrated, these viewing means comprise separate microscope objectives 702 and 711 supported for arcuate motions about the axis 118, and a common eyepiece 600. Further, a periscope is coupled to each of these objectives to render the optical axis of the objective collinear with the axis 118. Field splitting and combining means such as the mirrors 707, 708, 709 and 713 then present in the eyepiece one half of the field from each objective. In the embodiment illustrated, these periscopes take the form of the prisms 706 and 712. Inclusion of these periscopes has the highly advantageous result that the images presented by the microscopes (as viewed with the eyepiece 600) do not undergo rotation as the microscopes undergo arcuate motion about the axis 118 along the length of the opening 724 in FIG. 4 of the drawings.

According to still another feature of the invention, the wafer and mask are supported in separate stages in a carriage. Desirably, in accordance with the invention, these stages include each four links pivotally connected into a parallelogram. In the mask stage of FIG. 9, the four links may be identified at 258, 254, 256 and 240. In the wafer stage of FIG. 12 these links may be identified at 334, 332, 330 and 300. Means are provided to rotate the first of these links, i.e. the link 258 of FIG. 9 and the link 334 of FIG. 12, while holding stationary the adjacent link 254 of FIG. 9 or 332 of FIG. 12. Such rotation produces what has hereinabove been referred to as the X-motion of the mask or wafer. There are also provided means to translate the adjacent link 254 or 332. Thus in FIG. 9 translation of link 254 by the pinion 282 produces the Y-motion of the mask. Similarly in FIG. 12 translation up and down of the link 332 by the Y motor 366 translates the plate 300 and thereby the wafer in a Y-motion. Finally the combination of pinion 284, sector 268 and pin 276, and slot 278 of FIG. 9 constitute means to rotate the link 254 and thereby to rotate the mask. Similarly in FIG. 12, the motor 376 and associated elements 374, 372 and 368 impose rotation on the link 332, held against translation by the bar 342 and the bar 364, the Y motor being stationary. This rotation of the link 332 imposes a rotation or θ-motion on the plate 300 and thereby on the wafer.

According to another feature of the invention, means are provided to examine the image surface, i.e. the wafer, as imaged in the concave mirror. These comprise in FIG. 3 the eyepiece 600 together with the relay lenses 651, 652 and 653, which are enabled to co-act with the concave mirror 111 by virtue of the fact that the convex mirror 112 is partially transparent.

While the invention has been hereinabove described in terms of a presently preferred embodiment, the invention is not limited to the structure illustrated and described. Among the many alternative constructions which fall within the scope of the invention as understood by the applicants and as sought to be set forth in at least the broader of the appended claims, there may be mentioned the fact that the roof mirrors 116 and 117 may be replaced by a single plane mirror, at least if a rectilinearly moving carriage is employed. Neither is the invention limited to the use of a convex mirror whose radius is equal or substantially equal to one-half the radius of the concave mirror. Other combinations of concave and convex mirrors may be employed, preferably however those in which the algebraic sum of the powers of the reflective surfaces as utilized is zero. In the embodiment illustrated, this condition is fulfilled for a 2:1 ratio for the radii of curvature of the mirrors 111 and 112, since the image of the mask at the wafer is the result of one reflection of the mirror 11 and of two reflections at the mirror 111. With the convex mirror having a radius of curvature equal or substantially equal to two-thirds the radius of curvature of the concave mirror, the same result can be achieved by providing for three reflections at the concave mirror and two reflections at the convex mirror. With such an embodiment as with the embodiment which has been illustrated and described, the radius of curvature of the convex mirror is increased by a small amount above the value of two-thirds of the radius of the concave mirror in order to obtain optimum image quality for an extra-axial object position, i.e. for the position of the arcuate object area 223 hereinabove identified.

More generally, the invention comprehends all modifications of and departures from the construction hereinabove illustrated and described, properly falling within the spirit and scope of the appended claims.

The coarse viewing system of FIG. 3, the illumination system of FIG. 5, and the flexure device of FIG. 7 are the inventions of inventive of entities different from that of the present application, and will be claimed in separate applications presently to be filed and assigned to the assignee of the present application.

We claim:

1. Apparatus for photographically exposing an image-receiving surface to a light image of an object, said apparatus comprising:

an optical system having an optical axis and conjugate planes;

a carriage;

separate stages on said carriage for supporting an object surface and an image-receiving surface in said conjugate planes, respectively, each of said stages including four link members pivotally interconnected at points defining a parallelogram, one link member of each parallelogram being adapted for supporting thereon such object and image receiving surfaces, respectively;

means to rotate a second link member in each parallelogram respectively opposite said one link member thereof, rotation of said second link member causing concomitant rotation of an object surface and imagereceiving surface supported on said one link member of the respective parallelogram; and means to translate said second link member of each parallelogram and means to rotate a third link member in each parallelogram, translation of said second link member in each parallelogram causing concomitant translation of such object and image-receiving surfaces in one direction and rotation of said third link member in each parallelogram causing concomitant rotation of such object surface and image-receiving surface in a direction substantially normal to said one direction.

2. Apparatus according to claim 1 wherein the stage for the support of the object surface comprises a tray disposed on said opposite link member of said stage and means to shift said tray relatively on said opposite link member and transversely of the plane of an object surface supported thereon, and wherein said carriage includes abutment means to arrest said transverse motion of said tray with said object surface in one of said conjugate planes.

3. Apparatus according to claim 1 wherein said stage for support of an image-receiving surface includes an outer ring angularly movable with respect to said carriage and an aperture plate journaled for motion over said outer ring, said aperture plate constituting said opposite link member of said stage.

4. Apparatus according to claim 1 including flexure means coupling adjacent ones of said link members.

5. Apparatus according to claim 1 including:
means to illuminate an area in the conjugate plane in which the object surface is supported; and
means to advance said object surface and image-receiving surface relative to said optical system, simultaneously and at the same rate, in said conjugate planes so that said object surface moves transversely of said area in its respective conjugate plane, whereby the image-receiving surface moves simultaneously transversely of the image of said illuminated area in its respective conjugate plane.

6. Apparatus according to claim 1 wherein said conjugate planes are parallel to each other and to said optical axis, and which further comprises:
means to illuminate an area in the conjugate plane in which the object surface is supported; and
means mounting the optical system and carriage for arcuate pivotal movement relative to one another in a direction generally parallel to said optical axis for relatively moving said object surface and image-receiving surface simultaneously transversely of the respective conjugate planes and for moving said object surface transversely of said illuminated area.

7. Apparatus according to claim 6 wherein said optical system and illuminating means are in relatively fixed position and said carriage is pivoted for rotation about an axis that is fixed relative to the optical system.

8. Apparatus for photographically exposing an image-receiving surface to a light image of an object comprising:
an optical system having an optical axis and conjugate planes parallel to each other and to said optical axis;
a carriage;
separate stages on said carriage for supporting an object surface and an image-receiving surface in the positions of said conjugate planes, respectively;
means to illuminate an area in the conjugate plane in which the object surface is to be supported;
means mounting said optical system and carriage for arcuate pivotal movement relative to one another in a direction generally parallel to said optical axis thus relatively moving simultaneously the object surface and image-receiving surface supported on the respective stages transversely of the respective conjugate planes, while moving said object surface transversely of said illuminated area, said pivotal mounting means comprising a first member fixed on the carriage; a second member connected to said optical system and in fixed position relative thereto; and first and second flexible blades mounted in planes intersecting substantially at right angles along a line coincident with the axis of said pivotal movement, each of said blades having opposite end portions connected respectively to said first and second members.

* * * * *

UNITED STATES PATENT OFFICE
CERTIFICATE OF CORRECTION

Patent No. 4,068,947         Dated January 17, 1978

Inventor(s) Jere D. Buckley, David A. Markle; William H. Newell and Abe Offner

It is certified that error appears in the above-identified patent and that said Letters Patent are hereby corrected as shown below:

Column 1, line 45, before "invention," insert -- present --.

Column 1, line 61, change "application" to -- applicants --.

Column 1, line 61, change "is" to -- are --.

Column 1, line 65, change "the" to -- each --.

Column 2, line 40, change "presently" to -- currently --.

Column 5, line 16, change "parallelgram" to -- parallelogram --.

Column 7, line 55, change "differentially" to -- differently --.

Column 10, line 11, change "311)" to -- 511) --.

Column 10, line 18, change "3" to -- 5 --.

UNITED STATES PATENT OFFICE
CERTIFICATE OF CORRECTION

Patent No. 4,068,947      Dated January 17, 1978

Inventor(s) Jere D. Buckley, David A. Markle, William H. Newell & Abe Offner

It is certified that error appears in the above-identified patent and that said Letters Patent are hereby corrected as shown below:

Column 10, line 29, change "offer" to -- Offner --.

Column 10, line 30, change "extra" to -- extra-axial --.

Column 13, line 53, change "501" to -- 5% --.

Column 13, line 54, change "501" to --5% --.

Column 13, line 60, change "4" to -- 5 --.

Column 17, change "alignement" to --alignment --. (line 19)

Column 18, line 46, change "1B." to-118.--.

Column 20, line 4, change " 11" to -- 112 --.

Signed and Sealed this

Sixth Day of March 1979

[SEAL]

Attest:

RUTH C. MASON
Attesting Officer

DONALD W. BANNER
Commissioner of Patents and Trademarks